United States Patent
Nygaard, Jr.

(10) Patent No.: US 7,386,406 B2
(45) Date of Patent: Jun. 10, 2008

(54) FORCED-ALIGNMENT MEASUREMENT TOOLS FOR COMPOSITE EYE DIAGRAMS

(75) Inventor: Richard A. Nygaard, Jr., Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 959 days.

(21) Appl. No.: 10/699,353

(22) Filed: Oct. 31, 2003

(65) Prior Publication Data

US 2005/0100215 A1 May 12, 2005

(51) Int. Cl.
*G06F 19/00* (2006.01)
(52) U.S. Cl. .......................... 702/66; 702/64; 702/66; 702/67; 702/68; 702/69; 702/182; 375/232; 375/355; 382/181
(58) Field of Classification Search .................. 702/64, 702/65–69, 73, 117, 142, 182, 189; 375/232, 375/224, 355, 279, 226; 714/704, 724, 819; 382/167, 181; 370/252
See application file for complete search history.

(56) References Cited

U.S. PATENT DOCUMENTS

| | | | | |
|---|---|---|---|---|
| 5,305,350 A | * | 4/1994 | Budin et al. | 375/232 |
| 6,084,931 A | * | 7/2000 | Powell et al. | 375/355 |
| 2003/0116696 A1 | * | 6/2003 | Hoshide | 250/214 A |
| 2003/0187620 A1 | * | 10/2003 | Nygaard et al. | 702/189 |
| 2004/0024547 A1 | * | 2/2004 | Nygaard, Jr. | 702/67 |
| 2004/0153266 A1 | * | 8/2004 | Nygaard, Jr. | 702/68 |
| 2005/0027467 A1 | * | 2/2005 | Eskeldson et al. | 702/64 |

\* cited by examiner

*Primary Examiner*—Carol S Tsai

(57) ABSTRACT

An original composite eye diagram is reformulated by deliberately re-aligning its component eye diagrams according to some appropriate standard. This 'forced-alignment' shifts the components in one or both of the time and voltage axes. Notice is taken of the shift(s) for each channel, and that shift data is appended to the data structures for the original components. The content of the data structure can be read in its original form, or, read and force-aligned. A force-aligned composite eye diagram created from the re-aligned components can then be displayed, investigated and evaluated with any of the existing tools that used to analyze eye diagrams, simply by instructing the process that read a component eye diagram structure to reform that component as it is being read.

9 Claims, 15 Drawing Sheets

ASSIGNING CHANNELS TO GROUPS 1-3

A COMPOSITE EYE DIAGRAM FOR GROUP 1

82

| | ALIGNMENT REFERENCE IN CHANNEL | | GROUP REF | OFFSET (RELATIVE TO GROUP REFERENCE) | |
|---|---|---|---|---|---|
| | TIME (nSEC) | VOLTAGE (VOLTS) | | TIME (nSEC) | VOLTAGE (VOLTS) |
| GROUP2C:0 | -1.85 | -0.24 | | -0.01 | 0.04 |
| GROUP2C:1 | -1.71 | -0.28 | | 0.13 | -0.01 |
| GROUP2C:2 | -1.93 | -0.31 | | -0.09 | -0.04 |
| GROUP2C:3 | -1.88 | -0.27 | | -0.04 | 0.01 |
| GROUP2C:AVERAGE | -1.84 | -0.28 | X | 0.00 | 0.00 |

GROUP OF CHANNELS

| | ALIGNMENT REFERENCE IN CHANNEL | | GROUP REF | OFFSET (RELATIVE TO GROUP REFERENCE) | |
|---|---|---|---|---|---|
| | TIME (nSEC) | VOLTAGE (VOLTS) | | TIME (nSEC) | VOLTAGE (VOLTS) |
| GROUP4B:GROUP2C | -1.84 | -0.28 | X | 0.00 | 0.00 |
| GROUP4B:GROUP1B | -1.71 | -0.28 | | 0.13 | -0.01 |
| GROUP4B:GROUP3B | -1.93 | -0.31 | | -0.09 | -0.04 |
| GROUP4B:AVERAGE | -1.37 | -0.22 | | 0.47 | 0.06 |

GROUP OF GROUPS

*FIG. 13B*

|  | ALIGNMENT REFERENCE IN CHANNEL | | GROUP REF | OFFSET (RELATIVE TO GROUP REFERENCE) | |
|  | TIME (nSEC) | VOLTAGE (VOLTS) | | TIME (nSEC) | VOLTAGE (VOLTS) |
|---|---|---|---|---|---|
| GROUP4C:GROUP2C | -1.84 | -0.28 |   | -0.04 | -0.01 |
| GROUP4C:GROUP1B | -1.71 | -0.28 |   | 0.17 | -0.01 |
| GROUP4C:GROUP3B | -1.93 | -0.31 |   | -0.05 | -0.04 |
| GROUP4C:0 | -1.88 | -0.27 | X | 0.00 | 0.00 |
| GROUP4C:AVERAGE | -1.84 | -0.28 |   | 0.04 | -0.01 |

GROUP OF BOTH GROUPS AND CHANNELS

*FIG. 13C*

FORCED-ALIGNMENT MEASUREMENT TOOLS FOR COMPOSITE EYE DIAGRAMS

REFERENCE TO RELATED APPLICATIONS

The subject matter of the present Application pertains to the measurement of eye diagrams in general, and is especially well suited for use with one existing eye diagram measurement technique in particular, although it is by no means limited to use with only that technique. An implementation of that existing technique of interest is the subject matter of a U.S. Patent Application entitled METHOD AND APPARATUS FOR PERFORMING EYE DIAGRAM MEASUREMENTS bearing Ser. No. 10/020,673 which was filed on 29 Oct. 2001 by Richard A. Nygaard, Jr. and assigned to Agilent Technologies, Inc. Some extensions of that technique are also of interest. One is described in a U.S. Patent Application entitled COMPOSITE EYE DIAGRAMS bearing Ser. No. 10/061,918 which was filed on 31 Jan. 2002 by Richard A. Nygaard, Jr. & Jeffrey J. Haeffele and assigned to Agilent Technologies, Inc. Another is described in a U.S. Patent Application entitled EXPEDITED SELECTION OF ITEMS FROM A LIST WITHIN A DROP DOWN MENU OF AN EYE DIAGRAM ANALYZER bearing Ser. No. 10/120,565 which was filed 11 Apr. 2002 by Richard A. Nygaard, Jr. & Jeffrey J. Haeffele and assigned to Agilent Technologies, Inc. Still another is described in a U.S. Patent Application entitled ON-SCREEN TOOLS FOR EYE DIAGRAM MEASUREMENTS bearing Ser. No. 10/210,025 which was fled on 31 Jul. 2002 by Richard A. Nygaard, Jr. and assigned to Agilent Technologies, Inc. Because the topics described in those Applications are essentially points of departure for the present invention, and for the sake of brevity, "METHOD AND APPARATUS FOR PERFORMING EYE DIAGRAM MEASUREMENTS," "EXPEDITED SELECTION OF ITEMS FROM A LIST WITHIN A DROP DOWN MENU OF AN EYE DIAGRAM ANALYZER", "ON-SCREEN TOOLS FOR EYE DIAGRAM MEASUREMENTS" and "COMPOSITE EYE DIAGRAMS" are each hereby expressly incorporated herein by reference.

BACKGROUND OF THE INVENTION

Eye diagrams are a conventional format for representing parametric information about signals, and especially about digital signals. Various prior art eye diagram testers are known, but we shall call the technique described in "METHOD AND APPARATUS FOR PERFORMING EYE DIAGRAM MEASUREMENTS" and "COMPOSITE EYE DIAGRAMS" (which is an agreeable method for use herein), an Eye Diagram Analyzer, or EDA for short.

A modern eye diagram for a digital signal is not so much a trace formed continuously in the time domain (ala an analog oscilloscope), as it is an "eye" shape composed of closely spaced points (displayed dots, or illuminated pixels) representing many individual measurement samples [which are (time, voltage) pairs] taken upon separate instances of a signal occurring on a channel of interest, and which were then stored in a memory. Each measurement sample contributes to a displayed pixel. The eye shape appears to be continuous because the collection of pixels is rather dense, and because the signal is sampled at a large number of nearly adjacent locations.

In an eye diagram, an example of which is shown in FIG. 2, the vertical axis is voltage and the horizontal axis represents the differences in time (i.e., various offsets) between some reference event and the locations for the measurement samples. The reference event represents directly, or through some fixed delay, the expected point in time when the value of an applied data signal would be captured by some receiving circuit in an SUT (System Under Test). The reference event is generally an edge of a clock signal in the system under test, and in any event, is derived from an application of the SUT's clock to the Eye Diagram Analyzer. The time axis will generally have enough length to depict one complete eye-shape (cycle of an SUT signal) centered about the reference event, with sometimes perhaps several additional eyes (cycles) before and after.

Different (X, Y) regions within a (sample) space containing an eye diagram represent different "measurement points" that are combinations of time (an offset from the reference event) and voltage (that the signal might exhibit). What the example Eye Diagram Analyzer measures is the number of times, out of a counted number of clock cycles, that the signal on the channel being monitored passed through a selected measurement point. Then another measurement point is selected, and the process repeated until there are enough measurement points to construct an eye diagram of the desired resolution. Points along the visible trace of the eye diagram describe something about those (time, voltage) combinations that were observed to actually occur in the data signal under test. The value of a (time, voltage) combination is, of course, represented by its location in the presented eye diagram, but the color or intensity of the measured result can be determined in a way that assists in appreciating some additional relevant aspect of the measured data (frequently involving a question beginning "How often does . . . ?"). The range over which the measurement points are acquired is called a "sample space" and is defined during a measurement set-up operation. When using the example Eye Diagram Analyzer, we define the sample space and the resolution for neighboring measurement points first, start the measurement and then let the analyzer figure out later how to ascribe values to the pixels of the display. The "display" is, of course, an arbitrary graphic output device such as a printer or a window of some as yet unknown size in a window manager for a computer operating system (e.g., an X Window in X11).

The EDA of the incorporated "METHOD AND APPARATUS FOR PERFORMING EYE DIAGRAM MEASUREMENTS" operates by applying the clock signal from the SUT to a comparator circuit (to clean it up) whose output is then delayed by a convenient amount, say about a half cycle. The data signals to be measured are similarly cleaned up and delayed by a selected variable amount that ranges on either side of the delay used for the clock signal. The cleaned up and delayed clock is then the event reference mentioned above, and is used to determine the relative location (the selected offset) at which the individually threshold-compared-and-then-delayed data signals (the SUT data channels) are sampled for voltage. (There is also another embodiment for the EDA wherein the delays for the data signals are held constant (perhaps after being aligned for skew) while the reference delay is varied.)

This sampling of the individually threshold-compared-and-then-delayed data signals is actually two comparisons (say, greater than or equal to) performed twice in rapid succession, a very brief (but selectable) amount of time apart. If these two successive comparisons are different, then the input signal transitioned through the voltage region of interest, and we call this a hit. This is the manner of sampling that accomplishes the taking of the (time, voltage) pairs that are the basic data of the eye diagram measurement, and it is an alternative to digitizing with a conventional Analog-to-Digital Converter (ADC). We use it as an alternative to ADCs (analog to Digital Converters) because it works at the data rates of interest and is affordable considering the high number of channels (perhaps >>100) to which it is to be simultaneously applied. We have nothing against ADCs, but for high data rates they tend to be large, expensive, and dissipate a lot of power. We are attracted to alternatives that promise small size, are inexpensive and easy on power dissipation, while still operating at high data rates.

Different sampling voltages are obtained by varying the (staggered) comparison thresholds for the data signals. In one embodiment of the example EDA different times are obtained by varying the amount of delay in the data channel path, while leaving the clock signal path essentially fixed. In another embodiment the delay in the data channels is held constant (and preferably at a low value) and the delay in the clock signal path is varied. Skew between data channels may be removed by various techniques.

It is typical for an Eye Diagram Analyzer to perform measurements simultaneously on a plurality of different data signals, which we shall call channels. The number of hits at each measurement point is recorded in a data structure that can be indexed in a way that corresponds to the dimensions of the sample space (i.e., by time and by voltage). There can be one data structure per channel, or alternatively, a larger more complicated data structure that is also indexed by channel. The measurement proceeds by taking samples and filling the data structure, while at the same time the contents of the data structure(s) are processed to create the emerging eye diagram represented by the ever increasing amount of data in the data structure.

It is often the case that the utility of an eye diagram is needed for characterizing or discovering circumstances that are both erroneous and very occasional. It is also the case that some SUTs have a great many channels that are subject to investigation. Some busses have hundreds of member signals, for example. When faced with such circumstances, the "luxury" of having one individual eye diagram trace per SUT signal becomes an oppressive burden. (The idea is that there can easily be too many traces to view together for practical comparison, leading to a severely frustrated operator.)

Accordingly, another tool is needed to assist in eye diagram analysis for situations involving a large number of channels. Let us call the eye diagram for an individual channel a "component" eye diagram. The needed tool is the merging into one combined eye diagram presentation, for a useful grouping of related signals, of those separate component eye diagrams. Perhaps this is as simple as taking all the signals together as one single group and producing a single combined eye diagram from the merged data. Then we might simply combine them as if they were being stacked on top of one another, so to speak. That is, create a resulting eye diagram that is the superposition of the component eye diagrams. Alternatively, the signals of interest might, for timing or other signal format reasons, be construed as belonging to some family for one group and to a different family for another group. In that case we are inclined to consider each group separately, and then produce two separate combined eye diagrams, each of which corresponds to one of the groups. In any event, the operator can instruct the EDA to merge the data of individual eye diagrams for a specified plurality (family) of signals into one combined eye diagram. So now we have a combined eye diagram that probably has a fat trace (indicating that, as expected, not all signals have simultaneous and identical rise times, voltage levels, etc.). Independent of that, we now expect that, having merged everything together, if there is something unusual going on, even if only occasionally for just one channel, we will, in principle, be able to see it.

We shall term such a combined eye diagram, created from the merging of data for individual component eye diagrams, a "composite" eye diagram. It will be appreciated that, given the same channels and measurement parameters, no special activity is needed during the measurement per se to produce a composite eye diagram: the various channels are still measured individually, as before, and it is their corresponding data structure contents that are combined to produce the actual composite eye diagram. Indeed, the forming of composite eye diagrams can be a post processing operation performed after data acquisition, and as such, might be an afterthought, or might be subsequently variously repeated on the same acquired data according to different analysis paradigms newly decided upon as various results are indicated.

So, we have arrived at the following place. We have an instrument for measuring a large number of data signals and producing composite eye diagrams. It will be appreciated that the task of interpreting the salient features of a composite eye diagram of say, sixty-four channels, can still be a challenging exercise. In a previous Application we have addressed the issue of discovering which channel(s) is (are) responsible for some "notable aspect" of the composite eye diagram. That is fine as far as it goes, but there are additional surrounding circumstances that, if we knew them, might help us gain a more informed interpretation of what some such notable aspect of the composite means, or does not mean. In other words, those surrounding circumstances can help us to understand why that feature in the composite eye diagram is there.

An "interesting part" or "notable circumstance" in a composite eye diagram is most probably some part thereof that is significantly outside the expected boundary of an ideal eye diagram. That is, it is indicated by shape, or perhaps by the presence of certain colors in an unusual location of the shape. The immediate implication is that not all the channels are behaving in the same way. A cluster of issues can be addressed for any such interesting part of a composite eye diagram, but at root is the question: Is there a plurality of channels that are all misbehaving the same way? If we knew that, we could proceed to other questions, such as: Are there patterns hidden within this really ugly composite eye diagram? Are there groups of channels that have different patterns of misbehavior? Is the misbehavior constant? Let us take another step in this direction. Suppose we reformulated the composite eye diagram to "remove" certain of the "errors." Would the result help us understand where those errors are coming from, help us interpret their probable meaning, and help us better evaluate the actual operation of the System Under Test? Might such information alter our opinion of SUT behavior? What can an eye diagram analyzer do to help us answer these questions and better understand what is going on in the SUT?

SUMMARY OF THE INVENTION

A solution to the problem of characterizing the differences (measuring a degree of similarity, or a degree of dissimilarity) among component eye diagrams that make up an original composite eye diagram is to first reformulate the original composite by deliberately re-aligning the individual component eye diagrams according to some appropriate standard, a practice whose outcome we shall say produces a 'forced-alignment'. The forced-alignment shifts the components in one or both of the time and voltage axes. Notice is taken of the shift(s) for each channel, and that forced-alignment shift data is appended to the data structures for the original components. This allows the content of the data structure to be read and displayed in its original form, or, read, adjusted (force-aligned), and then displayed, as appropriate. A reformed (force-aligned) composite eye diagram created from the re-aligned components can then be displayed, investigated and evaluated with any of the existing tools that are used to analyze eye diagrams generally, simply by instructing the process that reads a component eye diagram data structure to reform (force-align) it by applying its forced-alignment data as the original measurements for that component eye diagram are being read. This leaves the original measurements intact, so that they may serve as the basis for other investigations. Existing composite eye diagrams can also be construed as an individual component (thus hiding or ignoring its origin), or as its collection of components, and used as a component in the above forced-alignment technique.

An automatic forced-alignment of the component eye diagrams involves two steps. First, for each component eye diagram some specified property (an earmark or alignment event) having a time value, a voltage value or a (time, voltage) value is automatically located. Second, each component is offset in time, voltage, or both, according to the difference between its earmark and some forced-alignment reference that is associated with the entire group of channels, which difference is the afore-mentioned forced-alignment shift data. A manual forced alignment is also possible, wherein the operator indicates, perhaps involving trial and error, the offsets to be used for each component eye diagram.

In the automatic cases, individual earmarks (alignment events) may be found automatically in various ways. For example, by finding the centroid of an eye opening for each channel in the group, or by finding a representative point of transition (the effective center of the "X" on either side of an eye opening) for each channel in the group. In the manual case, each individual component eye diagram can be shifted by a respectively associated manually specified amount, allowing the operator to individually force-align the component eye diagrams against a background composite eye diagram formed of all the other components in that composite.

In the automatic cases, the forced-alignment reference for the group may be the earmark of a selected component eye diagram or an average of all of the earmarks for the channels in the group. In the manual case the operator supplied the shifts, and no separate forced alignment reference is needed.

Thus, individual components within the group can be force-aligned to coincide with a selected component of the group, to share an average location for the entire group, or to share an arbitrarily specified location. The forced-alignment shift data appended to the eye diagram data structures can also be investigated to discern and report patterns in the amounts of shift. Patterns in the alignment data can be discovered by inspection of a report showing the amounts of forced-alignment shifting. Channels in the report can be sorted according to their degree of alignment. Channels that have the greatest amounts of alignment shift could, if desired, be placed in an ordered list of suspect channels and used as the source for expedited selection from within a list of a drop down menu that is useful in subsequent investigatory activities, such as viewing the individual component eye diagrams for the channels in the ordered list of suspect channels.

BRIEF DESCRIPTION OF THE DRAWINGS

FIGS. 13A-C depict various reports that may be generated from an instance of forced alignment upon different example groups.

Figure 1:
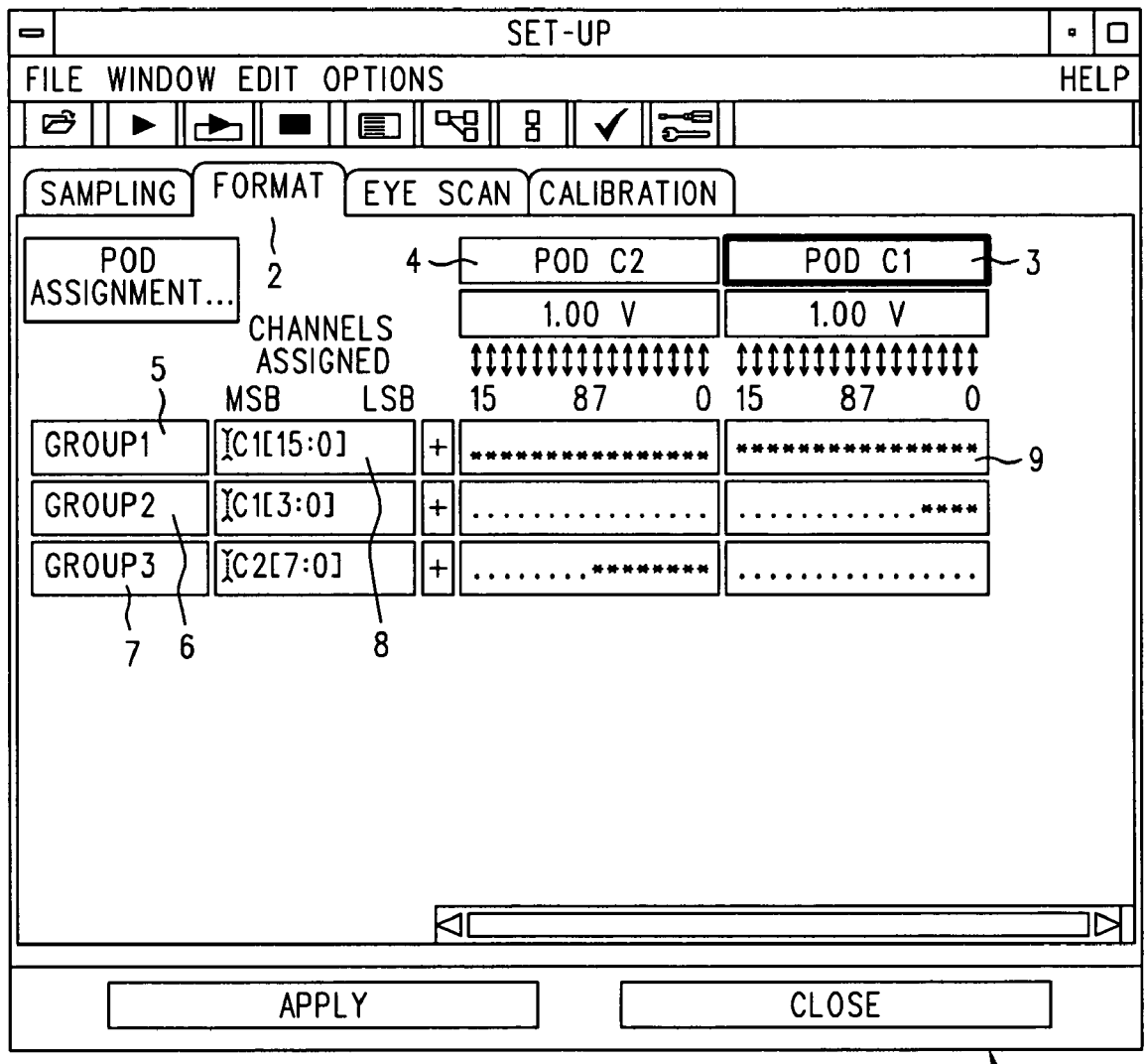
FIG. 1 is a prior art set-up menu for a modern eye diagram analyzer and which will produce the composite eye diagram of FIG. 2.
Figure 2:
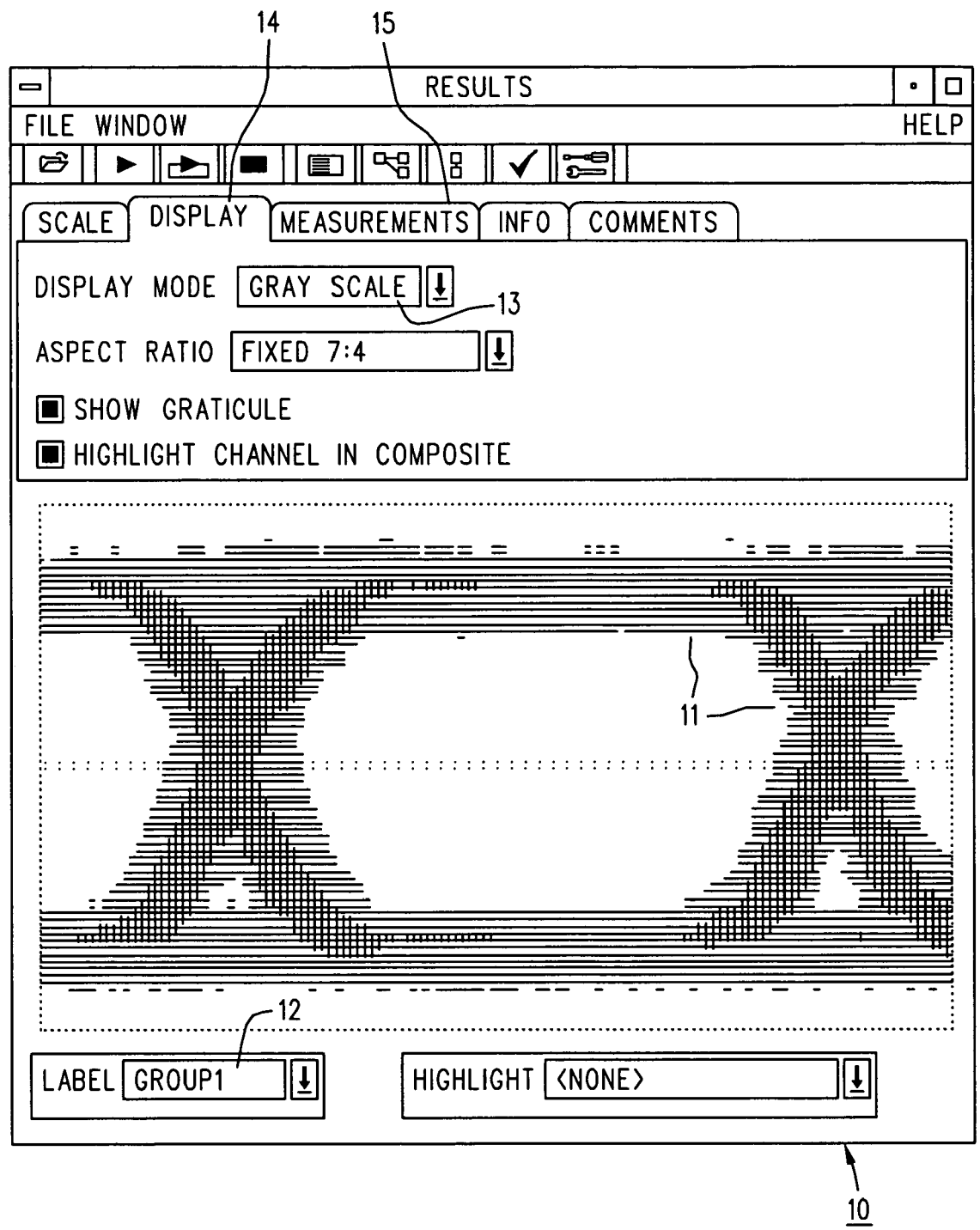
FIG. 2 is a prior art composite eye diagram presentation of the eye diagram analyzer set-up of FIG. 1 and serves as a work piece and point of departure for a description of certain measurement tools for use on composite eye diagrams.

DESCRIPTION OF A PREFERRED EMBODIMENT (Prior art FIGS. 1 and 2, and the text that briefly describes them, have been "borrowed" from earlier filed applications, and then "adjusted" for use herein. The intent is to reduce the need to actually consult the incorporated applications. Those already familiar with that subject matter may wish to skip ahead to FIG. 3.)

The overall system of which FIGS. 1 and 2 are a part may be a Logic Analyzer, such as the Agilent 16760A, or any of the Agilent 16753/4/5/6A, supervised by an embedded Unix or Linux operating system that executes on a controlling computer system within the hardware of the Eye Diagram Analyzer and that manages a captive application that is an Eye Diagram Analyzer control program. Certainly, other operating systems could be used, and the Eye Diagram Analyzer could also be a stand-alone item of test equipment, as opposed to an option to, or an extension of, a Logic Analyzer. The captive application program functions as a user interface ("control panel" for input), control unit for some data sampling hardware and memory for sample data storage, processing of stored data ("analysis"), and display of processed results ("control panel" for output). FIG. 1 is associated with a user interface for the operator's control inputs, and is a simplified line drawing representation of a menu of choices in a SET-UP screen that appears on a display CRT having a screen pointer and an associated mouse and keyboard (neither of which are shown). FIG. 2 is a line drawing representation of a menu of choices in a RESULTS screen, is also mouse driven, and pertains to the display of composite eye diagrams, where the rule for combining component eye diagrams has been selected or specified in yet some other screen (not shown). There is also a screen or menu at a higher level of abstraction (and which we have not shown, either) that indicates the SET-UP and RESULTS screen of FIGS. 1 and 2 as choices (i.e., is the vehicle for how the SET-UP and RESULTS screens are entered).

With respect now to FIG. 1, note that it illustrates a SET-UP screen 1 including a FORMAT tab 2 that has been selected to be the "front" tab (in accordance with well known Graphical User Interface [GUI] techniques). The FORMAT tab 2 allows the definition of groups of channels. This consists of specifying group names (5, 6 and 7, and which in this example are GROUP1, GROUP2 and GROUP3, respectively), and the association of channels with those named groups. Note that a legend "POD C1" appears in a box 3, beneath which are certain indicia, including a row of asterisks in control box 9. There are various locations to mount probe pods, and these are designated A, B, C, and so on. At each location there can be several such pods: pod #1, pod #2, etc. So, "POD C1" of box 3 means the #1 probe pod installed in the C location. Each probe pod can deal with sixteen signals, named zero to fifteen. The row of asterisks in control box 9 corresponds to a naturally ordered naming of the DUT input signals associated with that probe pod, and indicates which ones have been assigned. The legend in control box 8 indicates the channel assignment names that are associated with the row of asterisks. The net result of the figure is that GROUP1 is made up of the sixteen bits from POD C1 and that the names of the associated channels are C1[15], C1[14], . . . C1[0]. There is quite a bit of flexibility provided here, and we see that the least significant four of DUT input signals for GROUP1 are also assigned to GROUP2 as C1[3:0]. Note also that GROUP3 is C2[7:0]. There is a small data structure inside the EDA that records all such assignments of channels to groups. We shall be interested in various group, such as GROUP2, and now that we have seen how a group is defined, we turn to FIG. 2 to see what uses can be made of a group.

FIG. 2 illustrates a RESULTS screen 10 within which is displayed a composite eye diagram 11 for GROUP1. It is for GROUP1 because that is the choice that has been selected in control box 12. The eye diagram 11 is of a particular type of composite (there are various ways to assign a notion of "density" to a composite eye diagram) selected in accordance with a menu of such choices found in some convenient location, say, as part of the MEASUREMENTS tab 15. Alternatively, that menu (which is a conventional drop down or other standard GUI type menu) could be a part of the DISPLAY tab 14, which in the figure is currently the tab in front. Also part of the DISPLAY tab 14 is a drop down menu for DISPLAY MODE whose current selection is designated by the legend "GRAY SCALE" in control box 13. There are several choices that could have been selected here, many of which involve intensity and color combinations that are impossible to conveniently represent in a standard patent drawing. The reader will easily appreciate that when using an actual EDA what is desired is some way to make one part of the displayed eye diagram 11 distinguishable from another part. That is, unless some condition of interest shows up as an odd shape (wrong voltage, misplaced transition, etc.) that alters the outline, it might otherwise easily be missed. There are conditions of interest that do not affect the overall shape, but that are to be made visible. Changes in color are the usual way to change the displayed interior of the eye diagram to represent measured differences or non-homogeneous behaviors. Since that is, in itself, conventional, and since we can't show color in this disclosure, we picked a gray scale option that is not color oriented, and then use horizontal hatching to indicate a region of "darker gray" and horizontal and vertical hatching to denote a "brighter gray" region. This is a pretty simple example, and most users with a complex problem would likely opt for a displayed data format (color!) that is supportive of more extensive interpretations.

Figure 3:
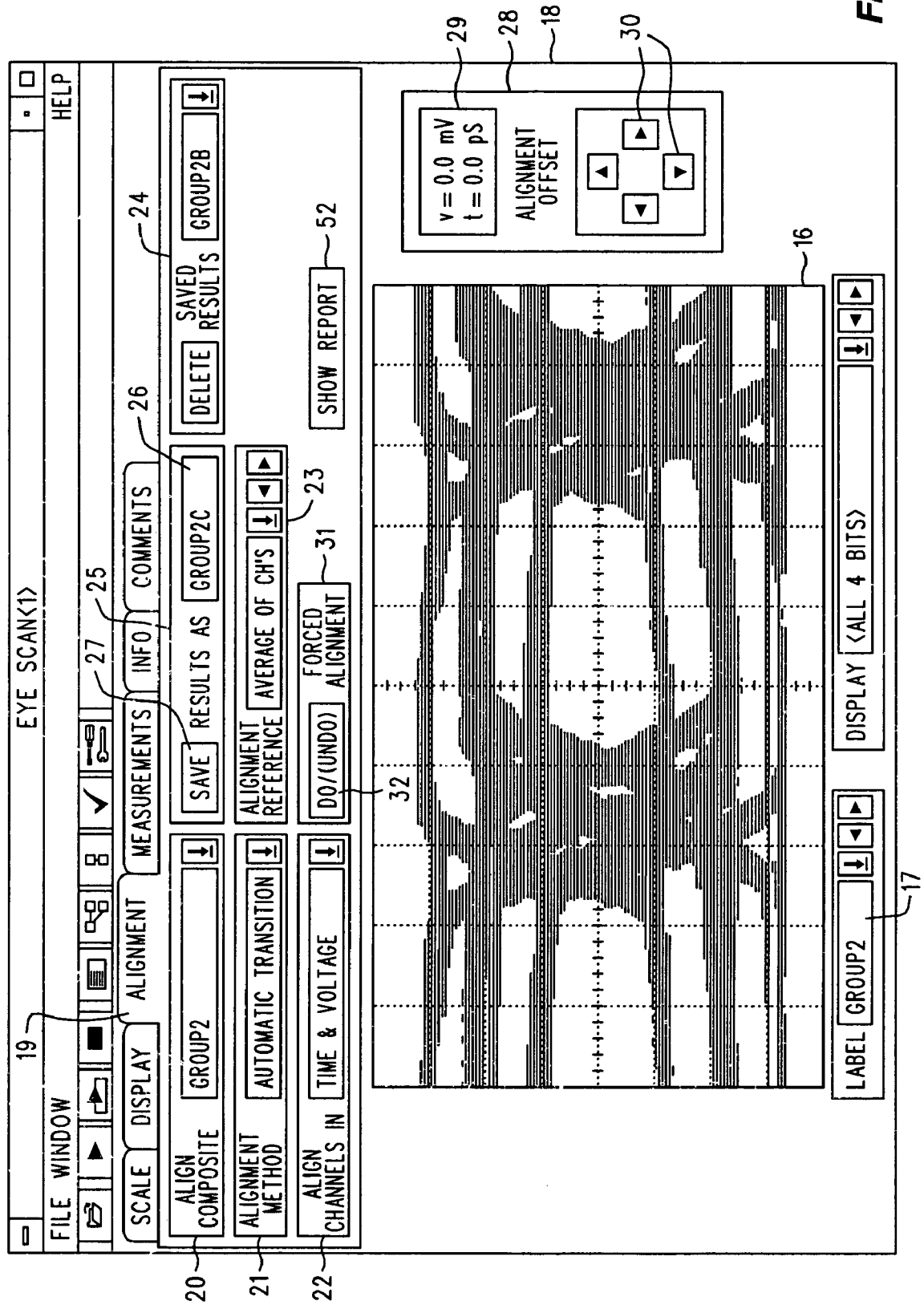
FIG. 3 is an illustration of an Eye Diagram Analyzer screen showing various controls related to forced alignment and a composite eye diagram exhibiting the effects of its four individual components that are variously skewed and that are susceptible of forced alignment.

Turning now to FIG. 3, shown therein is a screen 18 for an Eye Diagram Analyzer having forced-alignment capabilities. It includes as part of its GUI an ALIGNMENT tab 19 within which appears a composite eye diagram measurement 16 for a group of four signals collectively called 'GROUP2' (17). As an eye diagram, composite 16 is pretty ugly; it appears to exhibit the effects of recognizable components that are skewed both in time and voltage. [We have selected an example using only four signals to keep it manageable; a typical situation would likely involve a group having many more signals (say, thirty-two, or sixty-four, etc.). If the components of such a group had the same sorts of skew as found in GROUP2, the associated composite eye diagram would probably have (very!) 'fat' traces with eye openings of considerably reduced size, no individually recognizable components and little or no 'white space' (absence of hits) between the components.] Convinced that some mischief has infested the signals from the SUT, we set out to find a description of that mischief. Our plan is to force an alignment of the individual components of the composite eye diagram, be able to display and measure things about that aligned version, just as if it were that way to begin with (i.e., as if the aligned version were any other eye diagram we might be interested in), and also examine a report describing what had to be done to the individual component eye diagrams to create their alignment. Part of our plan involves the notion that if the various skews are treated as their own separate topic, we might able to analyze or assess other aspects of the operation of the System Under Test. That is, we might say: "Wow, that's pretty bad all right, but suppose we took out all the skews. Then does it look okay, or is there another separate problem in there, too?"

Upon some reflection, the first issue that we face is the very notion of alignment itself. That is, if we are to align two or more component eye diagrams, just what is it that is to be aligned? (Ordinarily, the individual channels have skew-adjusted delays relative to a common reference event in the SUT, such as a clock signal, that produces 'real' alignment in time. That is, measurement skew introduced by the Eye Diagram Analyzer itself is made to vanish through compensation. But if the SUT itself introduces significant skews the composite eye diagram becomes very confused.) Evidently, aligning to an SUT supplied reference event external to the measured signal (as is normal) is not always particularly convenient, nor is it always productive. So, given a result such as that shown in FIG. 3, we set out to align the measured signals to themselves, while keeping track of the amounts. Ah, but how to do it?

To begin with, the actual SUT signals themselves do not come equipped, as it were, with 'factory made index marks' that survive into their eye diagram representations. Instead, we have only non-ideal SUT signals with potentially flawed levels and flawed transitions. Thus, we can safely say that the component eye diagrams created from such SUT signals also do not have ready-made reference locations with an attached tag that says "USE ME FOR ALIGNMENT!" Furthermore, we have every reason to suspect that even component eye diagrams that are above suspicion ('known good') are not always 'thin' (i.e., are not of a minimal width in pixels when viewed at high, but still realistic, resolution). So, if we are thinking of using a location on an eye diagram itself as a reference location for forced-alignment, not only must we pick such a location (and do it in a corresponding way on other components in the group whose shapes are noticeably different), but we must also allow or account for variations in trace width (which is to say, for cycle to cycle behavior variations for individual signals). Furthermore, it occurs to us that the locations to be used for forced-alignment might not be actual locations on the traces of the component eye diagrams.

Once we get those issues out of the way, and have identified comparable locations for each component eye diagram, we can then compare the values in time and voltage for those identified comparable locations to produce one or more collections of offsets. Once that is in hand, the composite eye diagram can be reformulated with the offsets removed (i.e., with the component eye diagrams aligned by force) and one or more suitable reports issued about what was needed to produce that alignment (i.e., an analysis of the collections of offsets).

We now consider three useful ways to identify corresponding locations on individual eye diagrams in a collection that, while similar, are not necessarily (and are very probably not!) identical eye diagrams. The three ways are an automatic alignment of transitions, an automatic alignment of the centers of eye openings, and a manual method of individual component alignment that allows channels to be aligned according to deliberately selected choices (and sometimes useful as a last resort when things are simply too messy or complex for the automatic methods).

Since there may be more than one group, if we plan to align the channels in a group we first need to specify which group is to be affected. To that end, and referring now to FIGS. 3 and 4A-D, control box 20 ALIGN COMPOSITE (which is present on the ALIGNMENT tab 19) includes a field that indicates which groups is to be aligned; in the present example that group is GROUP2. Exactly which group from among existing defined groups may be selected by clicking on the arrow button 33. That produces a drop-down menu 34 that displays the existing defined groups. In the usual fashion the operator clicks on or otherwise selects an entry in the menu 34, which then closes while the selected choice becomes the group name displayed in the control box 20.

Once a group has been selected we can contemplate how we wish to align it. The choice is made using control box 21, which is operated with arrow button 35 and associated drop-down menu 36 in the same fashion as is control box 20. The three choices are the ones we mentioned earlier: AUTOMATIC TRANSITION, AUTOMATIC EYE OPENING, and MANUAL.

What AUTOMATIC TRANSITION does is use a standardized way of locating a point along a transition of interest. This will be done automatically for each channel in the group, and they will aligned by lining up those located points, using a selected channel as a starting point. Since there might be several cycles displayed, the EDA needs a way of knowing not only which channel to begin the alignment with, but also which transition in that channel to use, and it is convenient to establish the following "closest to the center" conventions. First, there is an ALIGNMENT REFERENCE mechanism described below to select the channel to be used as the starting point. Also, "alignment" might mean in just time, just voltage, or in both. Accordingly, there is also an ALIGN CHANNELS IN mechanism, described below. Next, for a transition alignment, and before launching the actual forced alignment, the operator previously zooms and/or pans the displayed and unaligned composite eye diagram until the transition of interest is at or very near center of the display 16, or, bracket it with cursors. In very confused cases where the transition of the particular channel that is of interest is difficult or impossible to distinguish, he may need to highlight that channel (described in a prior Application) to ensure that it is closest to the center. It will be the transition in the selected channel that is closest to the center of display 16 that is taken as the starting point for the automatic forced alignment.

To continue with choices made available in the ALIGNMENT METHOD control box 21, AUTOMATIC EYE OPENING is similar to AUTOMATIC TRANSITION, except that the standardized point for aligning to is found in the middle of the eye opening. It, too, will require the ALIGNMENT REFERENCE and ALIGN CHANNELS IN mechanisms, and it also uses the "closest to the center" convention.

In MANUAL the ALIGNMENT REFERENCE mechanism is not required. Instead, the operator will, for each channel he is interested in, either grab a point on that channel's eye diagram and drag it to where he wants it, or, use another mechanism to otherwise shift it around. There will be a way to see, as a backdrop against which to align, the emerging composite as the various channels are aligned, and thus align each additional channel to that accumulating result. The EDA remembers the manually created shift for each channel and treats it as though it were an automatically generated one. The ALIGN CHANNELS IN mechanism has an extra aspect here, in that if less than TIME & VOLTAGE is selected, then the non-selected parameter is not allow to vary, but is held fixed, forcing alignment to occur in only the other parameter.

Having selected the method of alignment, it is now appropriate to consider the parameters to be used in aligning the channels of the selected group. That is accomplished with the ALIGN CHANNELS IN control box 22. Just as in the other examples of FIGS. 4A and 4B, control box 22 of FIG. 4C has an arrow button 37 that produces a drop-down menu 38 that allows the selected choice of TIME & VOLTAGE, TIME and VOLTAGE to be the legend displayed in control box 22.

Figure 4A:
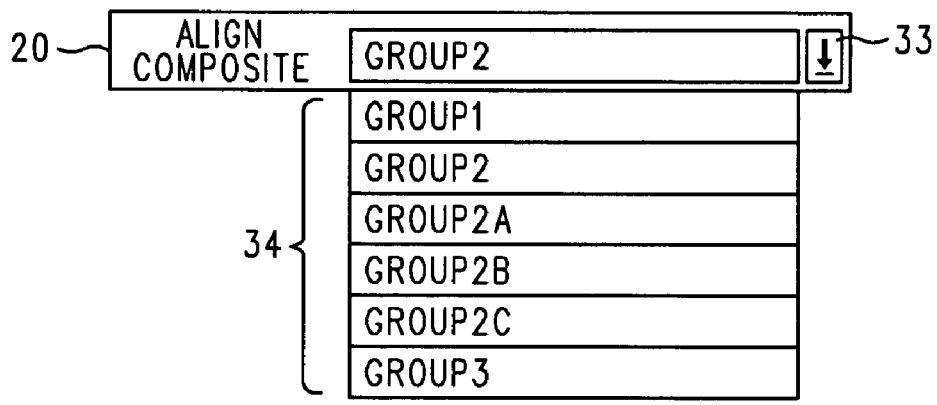
FIGS. 4A-E are illustrations of various drop down menus available in the screen of FIG. 3.
Figure 4B:
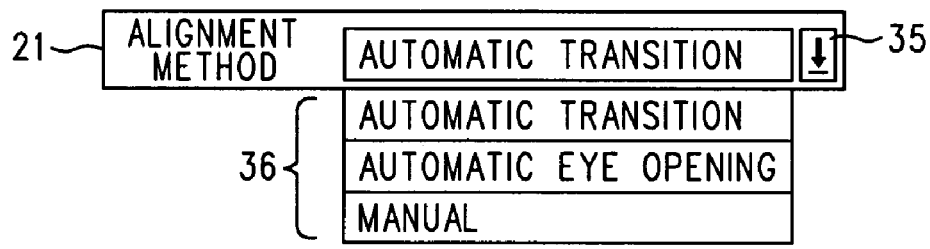
Figure 4C:
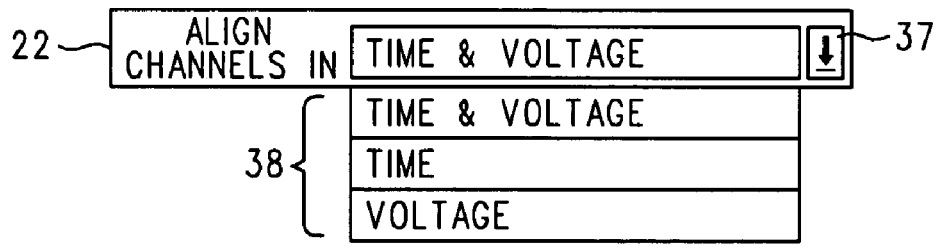
Figure 4D:
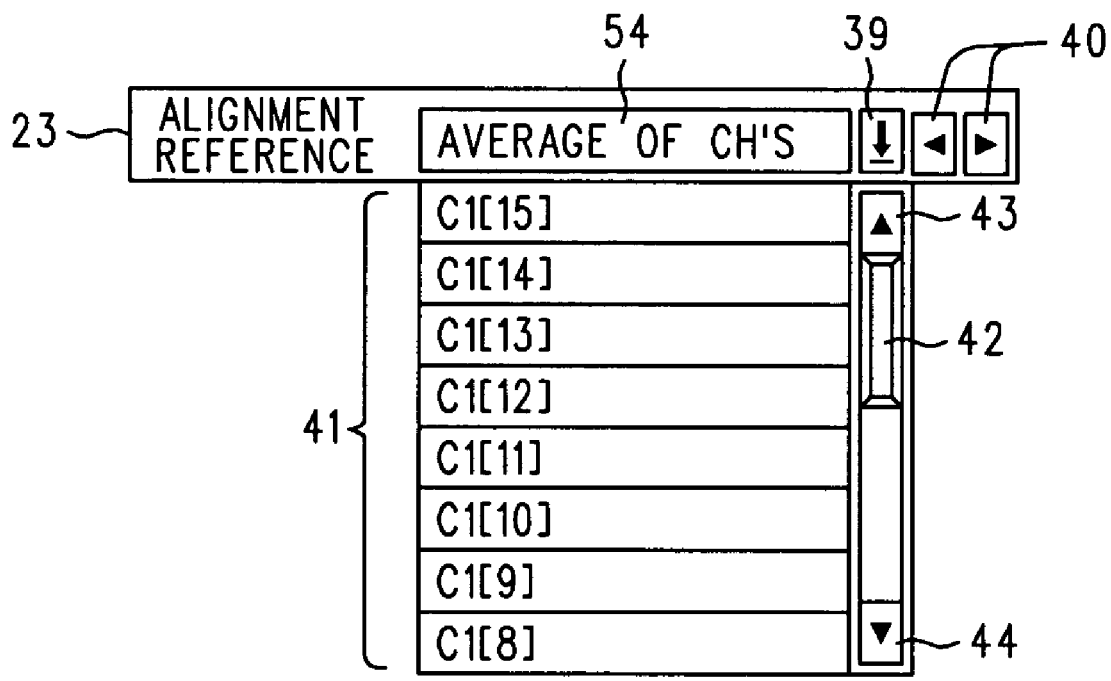

Referring now to FIG. 4D, the ALIGNMENT REFERENCE mechanism of control box 23 operates as follows. First, it has a drop down menu 41 that appears when button 39 is clicked. In this case (assume that it is GROUP1), owing to the number of channels that appear in the menu list 41, a slider control 42 appears to scroll the subset of channels that is visible, and arrow buttons 43 and 44 cooperate with this mechanism in the usual manner. By clicking on an entry in the menu 41 that choice becomes the selection, which is displayed in box 54, and the menu closes. In this case the previous selection (AVERAGE OF CH'S) is displayed in box 54, although it is not visible in the menu 41 owing the position of the slider control 42. The entries are the various channels in the selected group, as well as the entry AVERAGE OF CH'S. If an individual channel is selected, then that is the channel used as described above in the AUTOMATIC TRANSITION and AUTOMATIC EYE OPENING methods of alignment described above. The choice AVERAGE OF CH'S deserves a bit more discussion. For each channel in the group, and for the alignment method to be used, the channel feature to be aligned (eye opening, transition)

closest to the center of the display 16 is found as a description in time and voltage. Then the times are averaged, and the voltages are averaged.

It will be appreciated that a simple numeric average of the reference locations is one of many methods for finding an alignment reference based on contributions from more than one channel. A centroid method, using a sum of squares algorithm, may be a better choice in some circumstances. Another method is a weighted average, where the weighting factor for each channel represents some quality or other attribute of the channel. Such a quality could be the inverse of the noisiness of the measurement (perhaps measured by the standard deviation of the distribution of hits across the transition), the number of clock cycles over which the measurement was taken, or the width of the eye opening. Were these other methods to be available, additional choices would be added to the menu 41 to allow selection by the operator.

In any event, the resulting "averaged" location serves as the starting point for the forced alignment. Recall, of course, that the subsequent forced alignment may actually be performed in only one of the two dimensions, if so desired, according to the selection made with the ALIGN CHANNELS IN control box 22.

There is one other feature of the ALIGNMENT REFERENCE control box 23 that deserves mention, although it is somewhat peripheral to the notion of forced alignment. Note buttons 40; they point in opposite directions, and when clicked on automatically select the next choice in the menu list in order (for one of the buttons 40) or in reverse order (for the other button 40) according to the way the choices appear in the menu, without having to open the menu and manually make the next selection. This automatic selection mechanism operates in a manner described in the incorporated U.S. Patent Application entitled EXPEDITED SELECTION OF ITEMS FROM A LIST WITHIN A DROP DOWN MENU OF AN EYE DIAGRAM ANALYZER. It is interest because of how it cooperates with the production of force-aligned composite eye diagrams. A certain number of parameters must be specified in order for the EDA to perform an (AUTOMATIC method) forced alignment. Once they are all specified, clicking on the DO/UNDO button 32 (described below) causes the (AUTOMATIC method) forced alignment to occur. It is arranged that if one of those parameters is changed by the action of a button like 40, then there is a subsequent instance of an implied "DO" to perform the forced alignment with the changed parameters. This affords the operator with a very convenient way to park the mouse pointer in one spot (over a 40-like button) and click repeatedly without moving his gaze from a result of interest to see if something of note appears.

At this point everything needed has been specified to perform an (AUTOMATIC method) forced alignment. It will be accomplished by clicking on the DO/UNDO button 32 in control box 31. Of course, the result shown in the display (16) would become different than the unaligned composite in FIG. 3. We will indicate some results in another figure in due course. To undo the alignment (say, to correct a mistake, or simply to try something else) the DO/UNDO button 32 can be clicked again, and the forced alignment will be discarded and the original composite displayed again.

On the other hand, one might be pleased with the result, and desire to store it for future reference, perhaps for comparison against other alternatives. This may be accomplished by positioning the mouse cursor in field 26 of control box 25 (see FIG. 3) and typing suitable name that is meaningful or suggestive to the operator. Then the SAVE button 27 is clicked. The composite eye diagram that has just been aligned is stored as a new composite eye diagram, but with the particular alignment information attached. Now, and this is to be noted, EVERY eye diagram, even those that have never been aligned, has such alignment information, even if it is null. An eye diagram saved with the mechanism of control box 25 need not ever have been force-aligned, or in principle, even be a composite (it could be a group of one channel). The SAVE mechanism simply saves the "current" eye diagram as one having a different name (i.e., in a different file on a disc managed by the EDA). That name is subsequently available to the ALIGN COMPOSITE mechanism of control box 20. It follows then, that an earlier alignment can be retrieved with the ALIGN COMPOSITE control box, and, that a previously aligned composite can be re-aligned afresh, using the that previous alignment as a starting condition.

An additional feature using the SAVE button 27 may be desirable. The eye diagram to be saved might be a composite eye diagram that may or may not have been force aligned. The point is that it is a composite eye diagram. The feature is to ask the operator, before actually doing the SAVE operation, if the composite aspect should be "suppressed" so that the result appears to be simply a component eye diagram, as if it had been measured that way for some channel. Of course, there is no such channel, and the measurement is probably pretty ugly for an individual channel, but that does not prevent our storing of such an eye diagram under a name of our choice. Such an eye diagram fits into the data structure provided for eye diagrams, generally. We simply suppress the channel information, perhaps replacing it with an indicator indicating that such suppression was done. This feature is not exactly the same as the "GROUP OF GROUPS" mechanism that will later be described in connection with FIGS. 12 and 13, but is similar, in that it will allow a composite to be force-aligned with other items. The composite will be "frozen," in that it will be treated as a unit (a component that is not further divisible into smaller original parts). It will be as if the measurement were made on a single "synthetic" channel (which was the union of the channels the original composite was formed from).

Figure 4E:
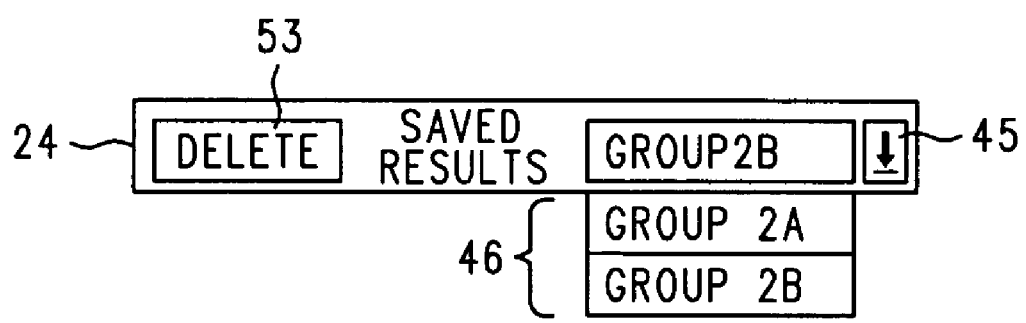
Figure 5:
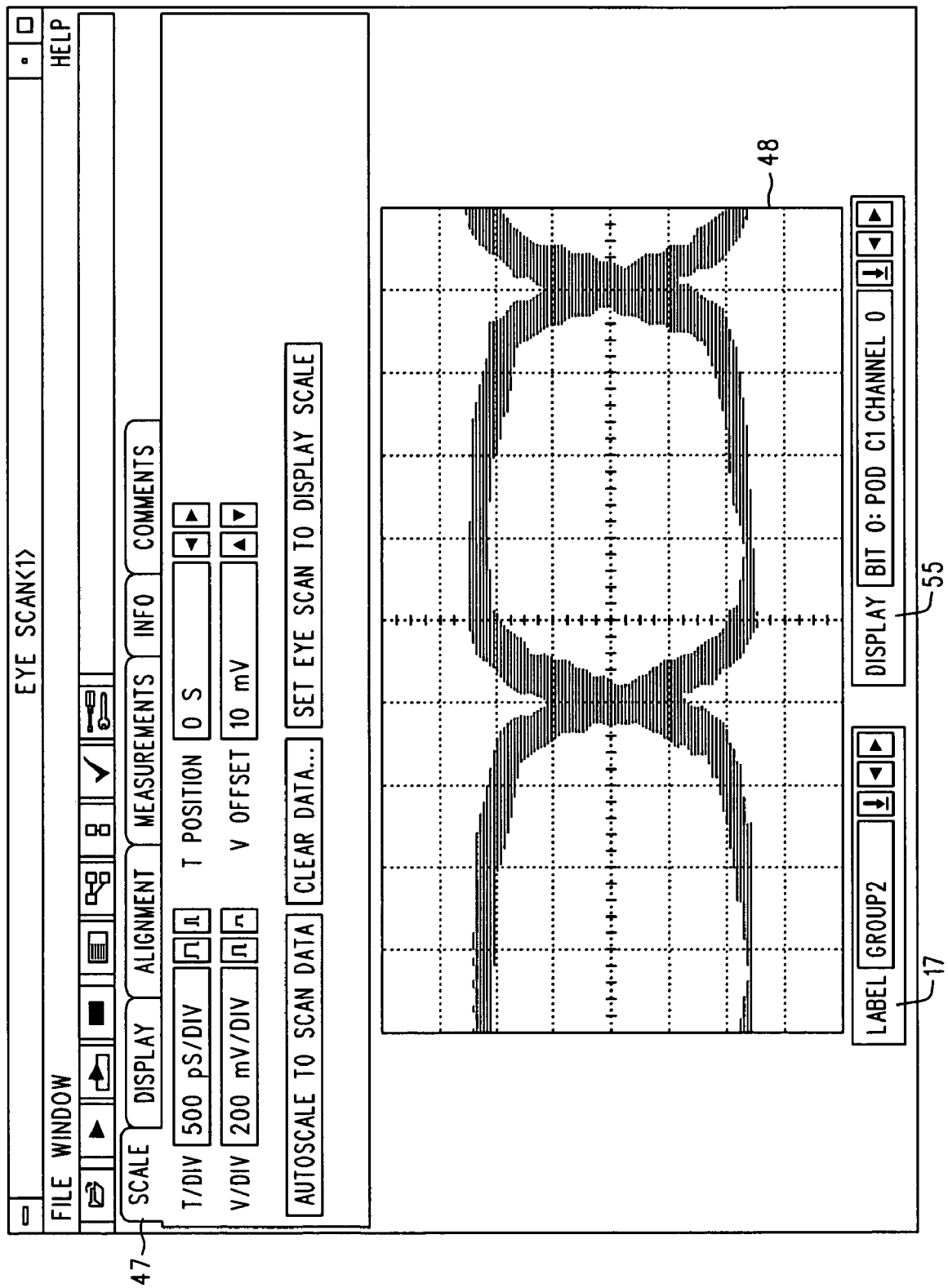
FIGS. 5-8 are the respective four individual eye diagrams of the composite eye diagram of FIG. 3.
Figure 6:
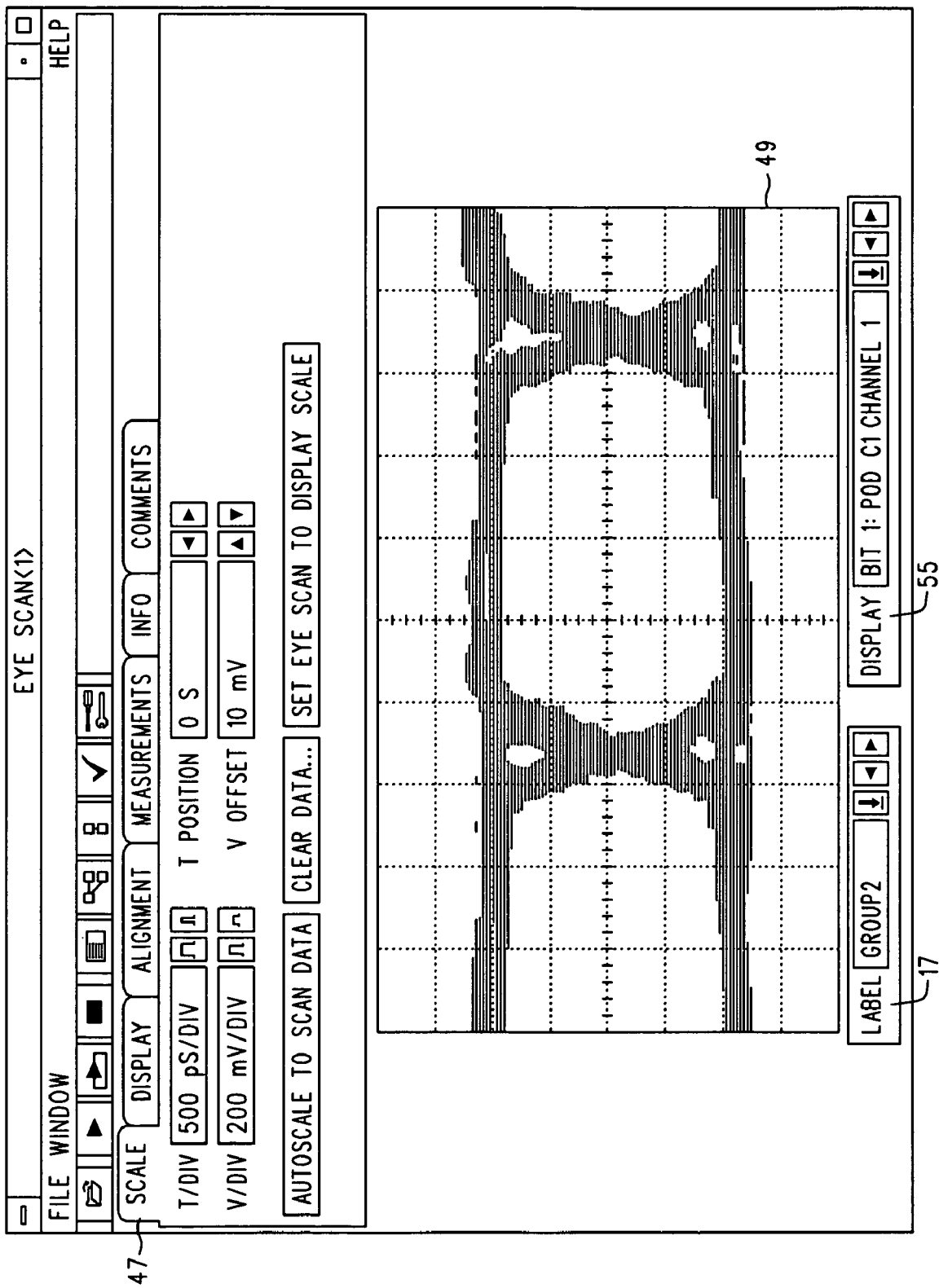
Figure 7:
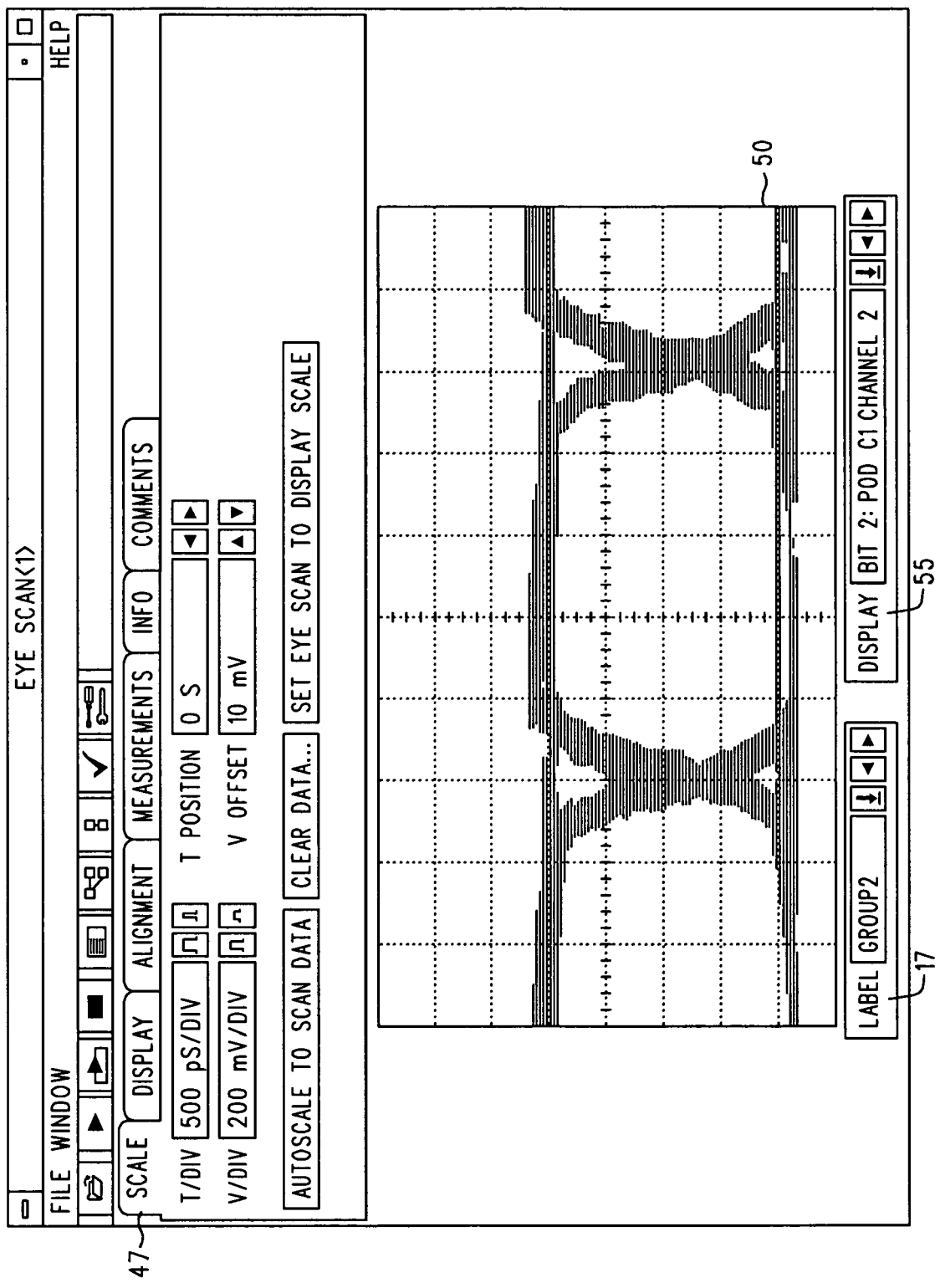
Figure 8:
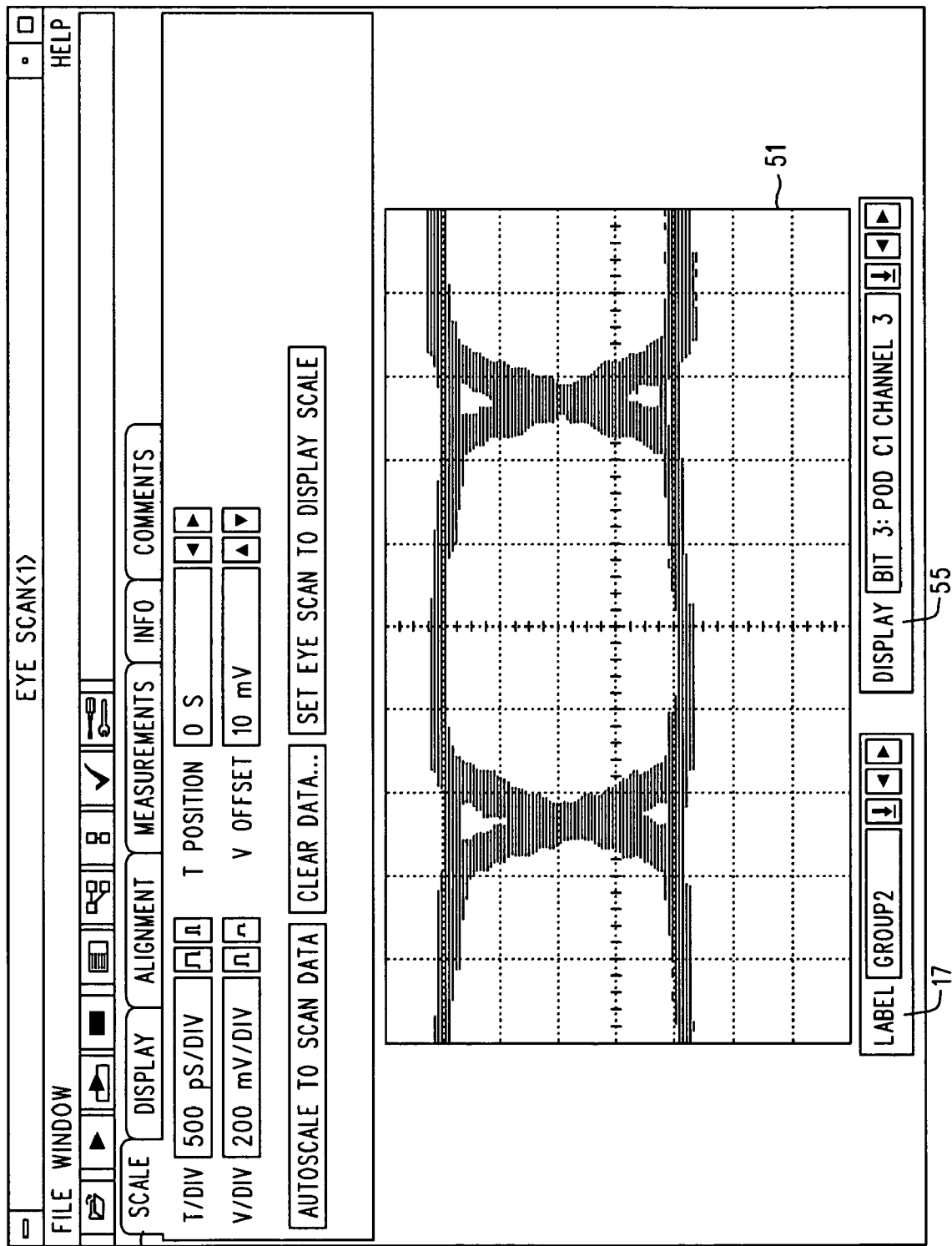

Of course, after a number of trials, it is possible that the system becomes awash with files containing forced alignments that are no longer of interest. They may be removed by the DELETE SAVED RESULTS mechanism of control box 24 shown in FIG. 4E. By clicking of arrow button 45 a menu 46 of saved files is shown, and a selection made. Then the DELETE button 53 is clicked, and the file is removed.

We turn now very briefly to another feature shown in FIG. 3. This is the ALIGNMENT OFFSET mechanism of control box 28. We shall have more to say about this mechanism in due course, and we should note that in FIG. 3 as shown (and since ALIGNMENT METHOD 21 is an automatic one) the ALIGNMENT OFFSET control box 28 would be grayed out (still visible but not available for use). The purpose of the ALIGNMENT OFFSET feature is to allow the operator to either build his own force-aligned composite, one channel at a time, or, finesse or experiment with channel by channel adjustments to the results of any previously completed forced-aligned composite eye diagram, including one created by automatic methods. To this end there is a box 29 that indicates offset values in time and voltage, and a box with arrows 30, of which two are vertical arrows (for incrementing and decrementing an offset voltage) and two are horizontal arrows (for incrementing and decrementing an offset time).

In final connection with FIG. 3, note the SHOW REPORT button 52. This activates a report generation mechanism that will be discussed in due course, and that provides the particulars for any specified force-aligned composite eye diagram.

Now note FIGS. 5-8, which are individual illustrations of the four different component eye diagrams (ch. 0 is 48, ch. 1 is 49, ch. 2 is 50 and ch. 3 is 51, respectively) that form the original composite eye diagram 16 of FIG. 3. They are shown under the auspices of a SCALE tab 47, most of whose features pertain to other aspects of EDA operation (much of which relate to panning and zooming), and which for the sake of brevity will be left undescribed. Note, however, control box 55 in each of the figures. It has the necessary controls to select which channel (of some group selected by control box 17) has its component eye diagram displayed. In each figure a different channel has been selected, as indicated in the control box 55. We shall use these component eye diagrams in an illustration of a MANUAL forced-alignment operation to be described next.

Figure 9:
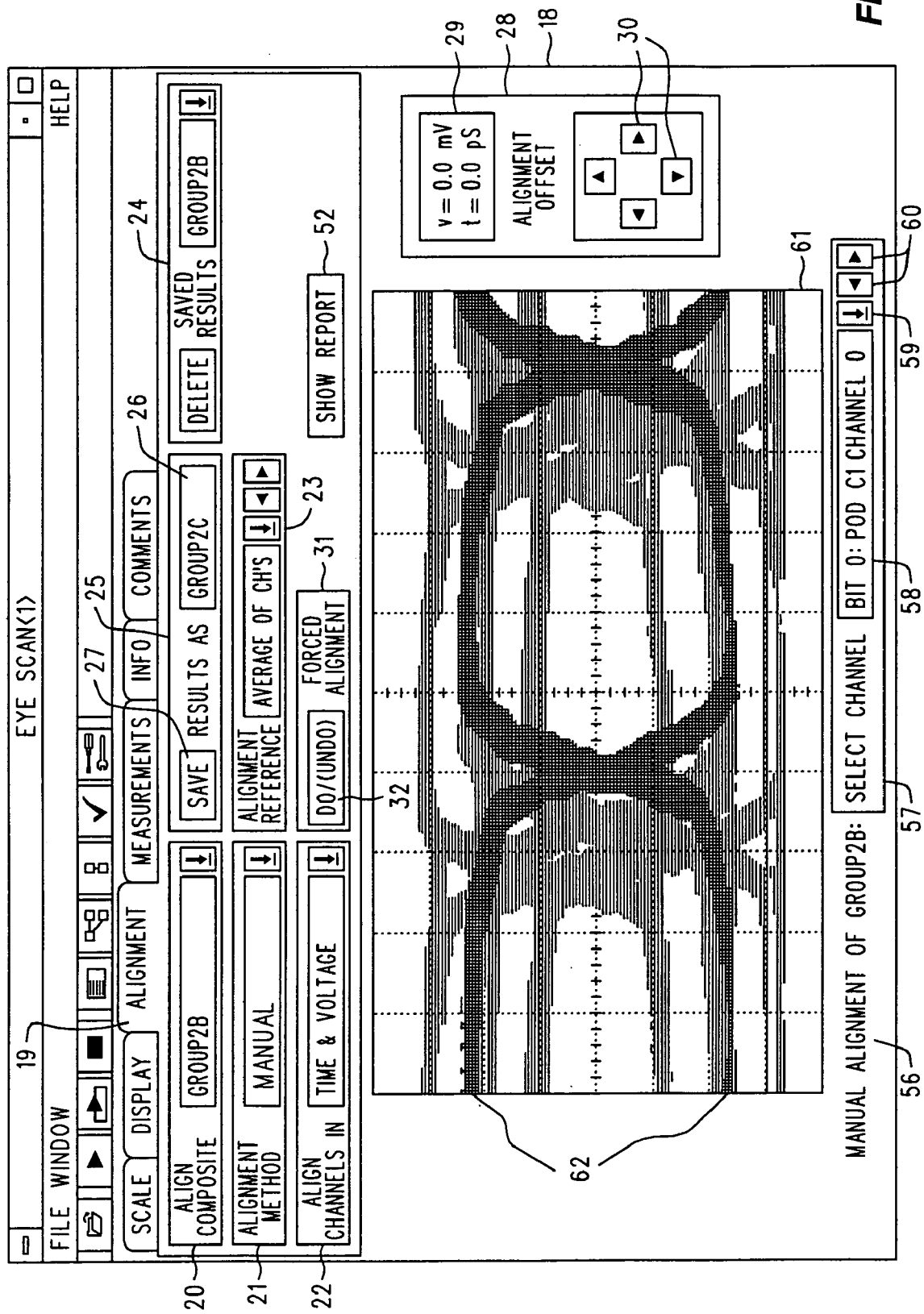
FIG. 9 is an illustration of screen that may be used to perform manual and automatic modes of forced eye diagram alignment.

We now suppose that the operator has decided to manually force-align the four channels associated with the example eye diagrams of FIGS. 5-8 (GROUP2). FIG. 9 illustrates the screen associated with the ALIGNMENT tab 19 after the operator has taken some preliminary steps in that direction. Among those steps are the following. First, the operator saved GROUP2 as, say, GROUP2B. The idea here is that he is going to "edit a file" (as in word processing), and that if it goes awry he wants to simply discard the result without having lost the original. Next, the operator has selected the ALIGNMENT METHOD (21) to be MANUAL, after which control box 28 is now no longer grayed out (owing to being in MANUAL), and legend 56 and control box 57 appear at the bottom of the screen. Legend 56 (MANUAL ALIGNMENT OF GROUP2B:) follows from the selection of GROUP2B made with control box 20 (ALIGN COMPOSITE). In addition, the DO/UNDO button 32 is now grayed out (MANUAL is not a unitary "do it" operation like the AUTOMATIC modes and the operator will "do" each channel). In further addition, the operator has used the menu selection mechanisms 59 or 60 of control box 57 to arrange that legend 58 describes the component eye diagram with which he wishes to begin the MANUAL alignment (BIT 0: POD C1 CHANNEL 0). It will be noted and appreciated that arrows 60 are another instance of the expedited selection from a menu mechanism, as were buttons 40 in FIG. 4D.

Note the displayed composite eye diagram 61 of GROUP2B. It is very similar to display 16 in FIG. 3; the difference is that channel 0 is highlighted (62) so that its position relative to the rest of the composite can be discerned. Now, if the operator decides that channel 0 is good where it is already, then he need do nothing, save perhaps select another channel, using the facilities of control box 57. On the other hand, he may decide that some (manual) alignment is in order. If so, then there are two ways that he can accomplish that. First, he may simply position the mouse cursor anywhere inside the window containing the composite. Then by holding a mouse button down while he moves the mouse the corresponding offsets are applied to the highlighted channel (i.e, its position changes to reflect the motion of the mouse). He can start and stop this mode of adjustment for that channel's alignment offsets as many times as desired. As those alignment offsets are induced, their values are reported in box 29, and the position of the highlighted channel changes. He can even leave this channel, do another and then return to this channel (by using the appropriate controls in control box 57, as needed). The alignment offsets for a channel are appended to its data base and implemented immediately without a "DO" being needed. The second method of applying alignment offsets is to click on the various buttons 30. The horizontal point buttons will move the selected (highlighted) component eye diagram in time, while the vertical ones will vary the position in voltage. Again, the changes induced are reported in box 29, and are implemented immediately. By "implemented immediately" we also mean that the location of the highlighted component (62) within the overall composite (61) is adjusted as the offsets are induced.

Presumably, after all the channels have been aligned to his satisfaction, the resulting composite is now more "tidy" and he might then save the result as GROUP2C. Later on, he might come back and further manipulate GROUP2C, if that were desired.

We turn now to the AUTOMATIC TRANSITION mode of forced eye diagram alignment. As a place to start, refer again to FIG. 3, and note that the ALIGNMENT METHOD control box 21 already indicates AUTOMATIC TRANSITION, and that the measurement screen (or window) shows a composite eye diagram 16 for GROUP2 (17). Further note that the ALIGNMENT REFERENCE control box 23 indicates 'AVERAGE OF CH'S' and that the ALIGN CHANNELS IN control box 22 indicates that the channels of the GROUP of interest (GROUP2) are to be aligned in (both) 'TIME & VOLTAGE'. We will come back to the example of 'AVERAGE OF CH'S' shortly, but for now assume that the operator uses the mechanism described in connection with FIG. 4D to select as the ALIGNMENT REFERENCE bit 2 of GROUP2. That is, the other channels in GROUP2 are to be aligned in both time and voltage to the channel called bit 2.

What that means is that we need to locate a (time, voltage) pair in the component eye diagram for bit 2 that will serve as a location within the transition of bit 2 for deciding how much to offset the other channels to create forced alignment. Going further, it means that once we have such a mechanism for finding such a representative transition location for bit 2 we will use it again for each of the other channels in the group, and the decision about how much to offset those other channels will be based on the differences between those various representative (time, voltage) pairs.

Figure 10:
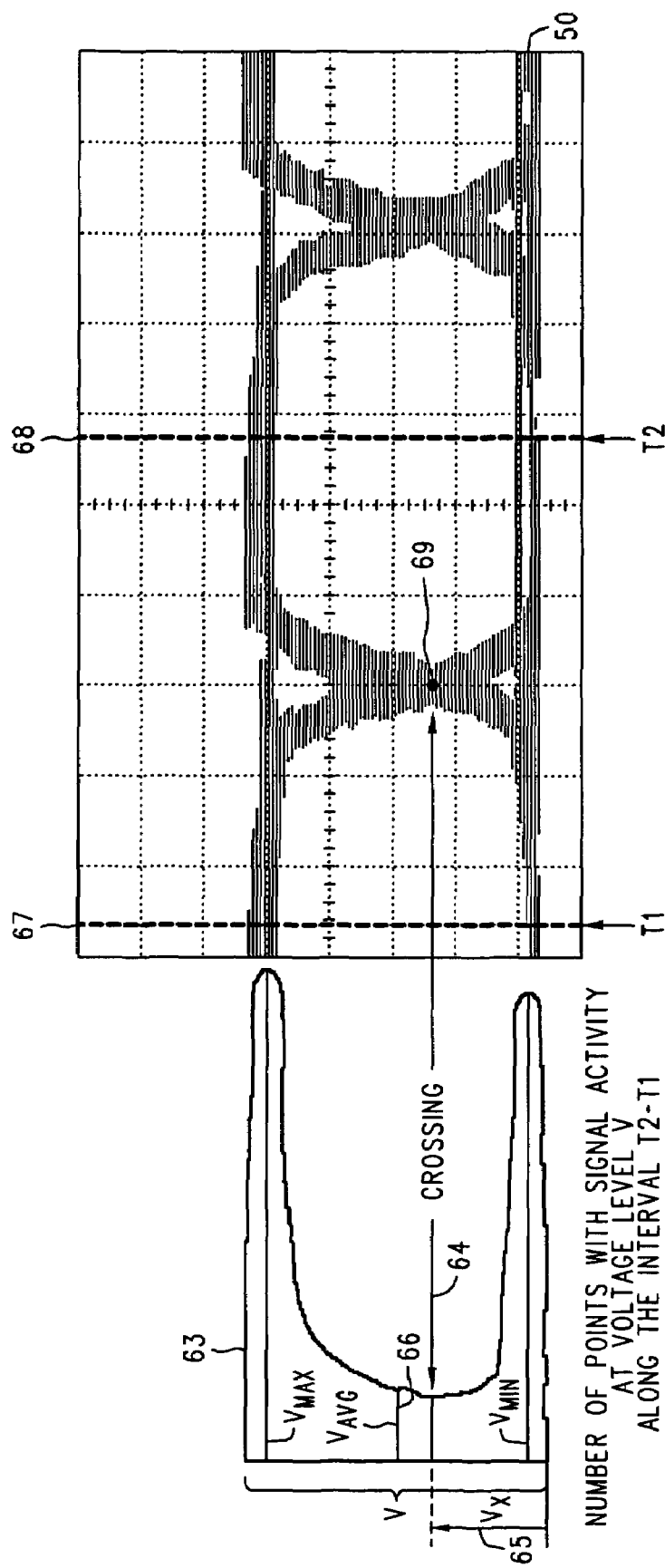
FIG. 10 depicts, for use in the AUTOMATIC TRANSITION mode of operation, methods of locating transition voltages in an eye diagram using a histogram measurement tool.

So, maintaining the assumptions set out above, refer now to FIG. 10. It shows a histogram 63 adjacent the component eye diagram 50 for bit 2 (we've robbed it from FIG. 7). Suppose that it has been decided that interval T1 to T2 in FIG. 10 contains and identifies the transition (69) in bit 2 that we wish to be the source of the ALIGNMENT REFERENCE. For example, a cursor line 67 corresponding to T1 and a cursor line 68 corresponding to T2 could appear in the eye diagram display upon the selection of AUTOMATIC TRANSITION in control box 21. The operator would then horizontally drag those cursors with the mouse and drop them such that they bracket the particular transition that is intended to serve as the initial reference. The histogram 63 can provide us with at least two ways to find a suitable (time, voltage) pair that can serve as a representative transition location (69) in bit 2. (The generation of similar histogram data is discussed in the incorporated ON-SCREEN TOOLS FOR EYE DIAGRAM MEASUREMENTS.)

The histogram 63 has a voltage axis and a "number of points . . . " axis, as indicated by the annotation in FIG. 10. We have indicated with arrow 64 that one way to identify the voltage portion of a transition location is to find where the rising and falling edges of the eye diagram cross each other ("CROSSING"). Clearly, that voltage is the one for which the least number of pixels (within the T1-T2 interval) are needed to form the trace of the eye diagram 50. (Upon reflection, it will be appreciated that the "least number of pixels" idea is not the same notion as the "least number of hits" would be. That is, we are prepared to ignore any color variations in the trace, and simply respond to its width.) So, we determine by inspection of the histogram 63 that a voltage value $V_x$ 65 has the minimum number of points (pixels) in the eye diagram within the interval of T1 to T2.

Another way to determine a voltage for a representative transition location would be to notice by inspection that values of $V_{max}$ and $V_{min}$, and then average them to find $V_{avg}$ 66.

In any event, we now have a voltage to use for an alignment reference, and if we were aligning only voltages (which is a choice in the menu 38 of FIG. 4C), we could then proceed. However, if we are to align in both voltage and time, then we still need to also provide a time value to go with the found voltage value ($V_x$ 65 or $V_{avg}$ 66). To do that, we simply find the midpoint of the horizontal line segment (which is a time interval) that describes the eye diagram (within just T1 and T2, of course, and not for the entire component eye diagram!) at that voltage. Then we would have a full (time, voltage) pair with which to work.

So, let's consider the case where we have a full (time, voltage) and intend to align in both time and voltage. In our example of GROUP2, then, there would be three other channels that we would need to find (using the same $V_x$ or $V_{avg}$ as was used for the ALIGNMENT REFERENCE channel, which in our example was bit 2) corresponding (time, voltage) pairs. Clearly, if it can be done of bit 2 it can also be done for the other channels. So now what do we do with the (in this case) four pairs of (time, voltage) values?

If we are to align in both time and voltage to bit 2, as is the assumption, then the EDA will compare the (time, voltage) pair for each of the other three channels to that of bit 2, and obtain three differential (time, voltage) pairs. These are the offsets that are to be applied to those three channels. This forced alignment would occur when the operator clicks on the DO/UNDO button 32 of FIG. 3. The resulting force-aligned composite eye diagram would then appear in the measurement display window. Clicking on the DO/UNDO button 32 again would restore the composite eye diagram to its previous (non-aligned) condition.

As a somewhat different example, consider the case where the ALIGNMENT REFERENCE control box 23 indicates the choice AVERAGE OF CH'S choice 54 (as in FIGS. 3 and 4D). Then rather than forming a collection of differential (time, voltage) pairs relative to bit 2, the EDA would simply average all the time values and all the voltage values to form an average (time, voltage) pair that would then serve as the basis for making the differential (time, voltage) pairs for all the channels in the group.

The examples given thus far have involved alignment in both time and voltage. If only alignment in time were desired, then the voltage values would be left alone, as would be the time values if alignment were being performed in just voltage.

Figure 11:
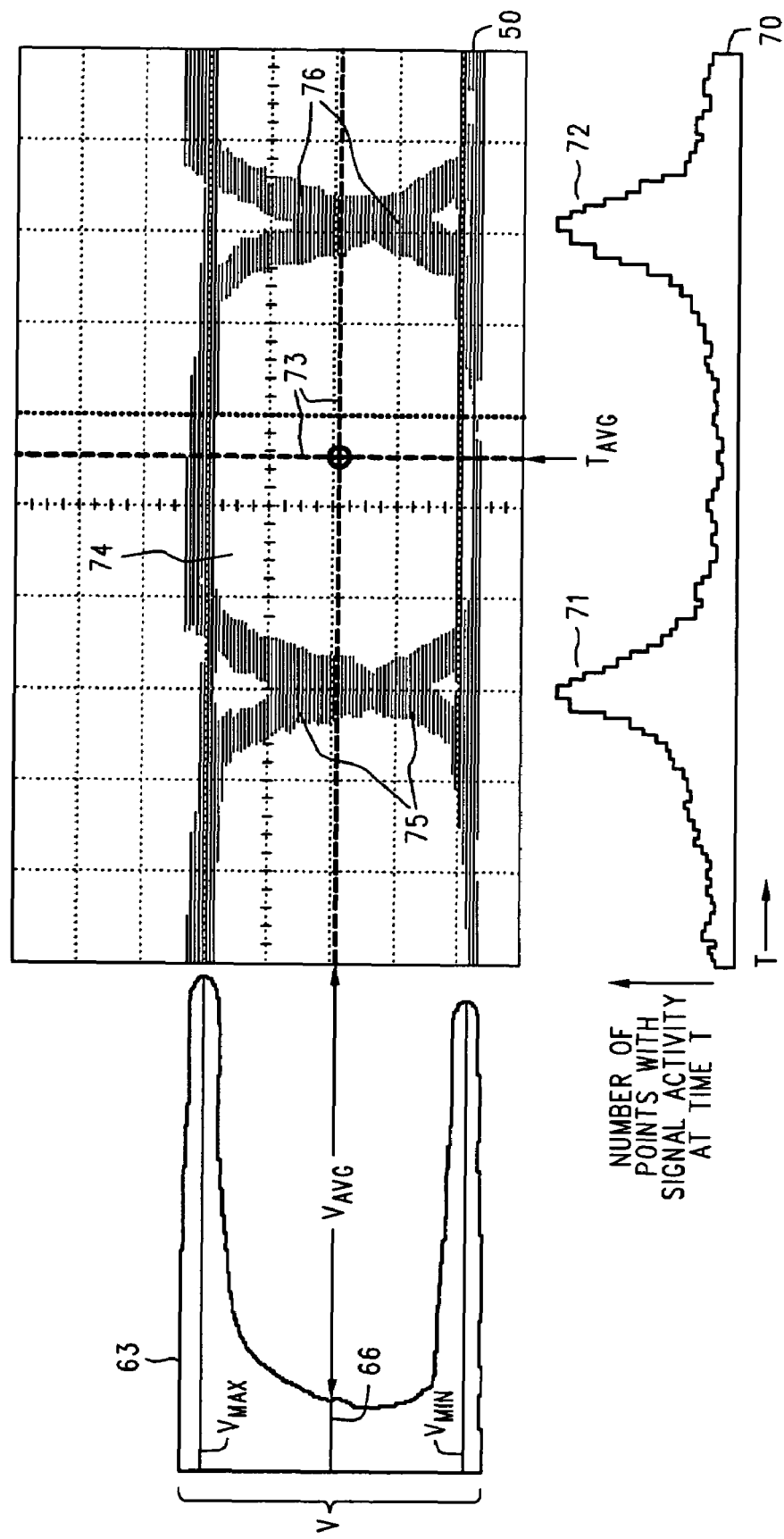
FIG. 11 depicts a method of locating an eye opening center point for used in the AUTOMATIC EYE OPENING mode of operation.

Now consider FIG. 11 and the case where the ALIGNMENT METHOD control box shows the legend AUTOMATIC EYE OPENING (a choice in menu 36 of FIG. 4B). The general manner of operation is very much like that just described above in connection with the AUTOMATIC TRANSITION mode. The main difference is that, instead of locating a point on the transition for the channels of GROUP2, we wish to find ones that essentially represent the centers of their eye openings. In other words, we need to substitute a "center of eye opening" point for a "transition point" in what is otherwise an entirely analogous situation for the AUTOMATIC TRANSITION mode of operation. We are thinking especially here of whether the ALIGNMENT REFERENCE is a (time, voltage) pair associated with a specified channel or is the average of all channels in the group. Accordingly, we shall not repeat all of THAT stuff for the AUTOMATIC EYE OPENING mode, and will describe instead how a (time, voltage) point representing of the center of an eye opening is automatically found. It will be appreciated that such points will then be found as needed and used as in the AUTOMATIC TRANSITION case.

Refer now to FIG. 11, and note that the histogram 63 is used to locate $V_{AVG}$ for eye diagram opening 74. It will be for eye opening 74 (and not some other eye opening, although it could be that way) because the cursor 73 formed of heavy lines appeared in the measurement window when the AUTOMATIC EYE OPENING mode of operation was selected. The operator then dragged and dropped the cursor 73 to lie within the eye opening of interest. In this case the eye opening of interest is 74, and is bounded on the left by transitions 75 and on the right by transitions 76. We prefer to use the $V_{AVG}$ method of FIG. 10 to find the voltage component of the desired (time, voltage) pair, which is then accomplished as described in connection with FIG. 10. What we need in addition is a time value.

In that connection, note histogram 70. It describes the numbers of points (pixels, and not hits) versus time, and clearly has peaks 71 and 72 that correspond to respective transitions 75 and 76 that bound the eye opening 74. The time (T) values for peaks 71 and 72 are found by the firmware within the EDA, and the average of (or midpoint between) those time values gives a $T_{AVG}$ that is then used with $V_{AVG}$ to form the desired (time, voltage) pair.

Before considering the report generation mechanism that can be invoked to discover patterns of behavior in the forced alignment, we return briefly to the topic of FIG. 1, which concerned the assignment of channels to groups. We wish now to extend that mechanism so that there can be groups of groups, or groups composed of groups and channels. To see how this is accomplished, refer now to FIG. 12. It depicts an alternate embodiment of the FORMAT tab 2 that includes a GROUPS ASSIGNED column 77. In most respects, the bulk of the figure is the same as FIG. 1, save that the added GROUPS ASSIGNED column is present, and that subsequently the amount of information to be displayed exceeds the width of the screen. In accordance with this last situation, note that the slider bar 80 of scroll mechanism 79 is now shorter than in FIG. 1, inviting the operator to drag it to the right and reveal the missing right-hand portions of the screen.

Figure 12:
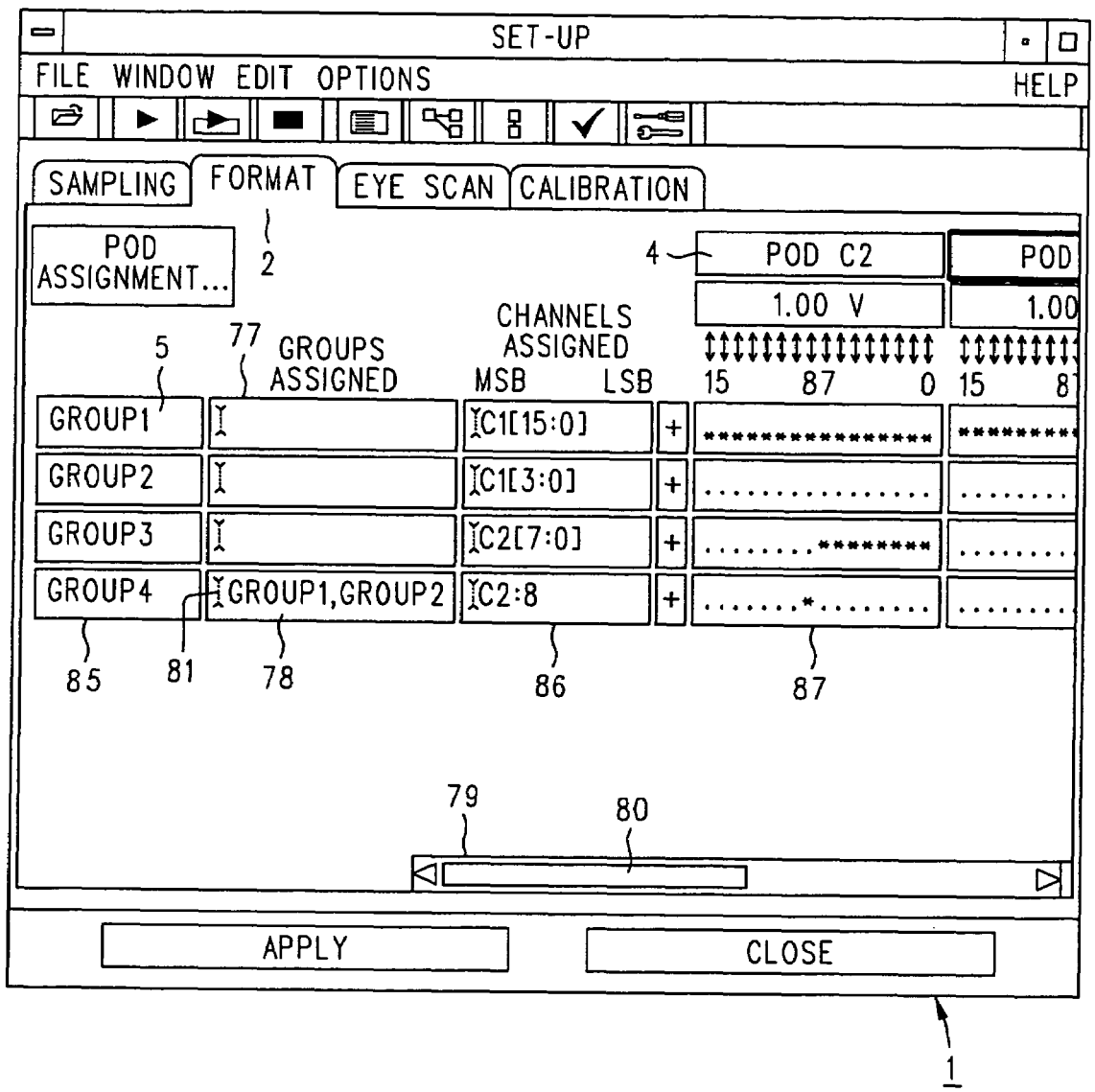
FIG. 12 depicts a set-up menu that allows defining groups composed of other groups and also of groups and individual channels.

The import of FIG. 12 is that the operator has defined a group called GROUP4 (see box 85) that is composed of GROUP1, GROUP2, GROUP3 and BIT8 of pod C2. To do this the user typed the legend "GROUP4" into box 85, typed the legends "GROUP1, GROUP2, GROUP3" into box 78, and interacted with boxes 86 and 87 as previously explained in connection with FIG. 1. The only untidy aspect of this is that the long length of legends "GROUP1, GROUP2, GROUP3" does not fit into the box 78. However, there is an established GUI technique for dealing with this where text being typed scrolls to the left once the box (78) is full, and a cursor 81 allows repositioning for viewing and editing of the box's contents.

The significance of being able to define a group of groups (or, if you will, a super group) is that it allows a convenient level of organization to emerge during forced alignment. Say, for example, that there was a bus with sixty-four channels, where each eight channels has its own clock. Such arrangements exist, and it is useful to align the groups of eight channels as separate groups, and then consider the eight groups as one larger group. Once defined, GROUP4 is not handled any differently than any of the other groups discussed in connection with FIGS. 3 and 4A-E. It will be appreciated that the "group of groups" idea does not involve losing the individual channel identities that are ordinarily associated with composite eye diagrams, as was discussed in connection with the option for the SAVE button. It does provide a way to force align composite eye diagrams with other composite eye diagrams, or with other individual channels.

Now refer to FIGS. 13A-C. They depict three tables of offsets generated by forced alignment of different groups. These tables appear in suitable screens after the SHOW REPORT button 52 is clicked. In FIG. 13A table 82 indicates that a group called GROUP2C used the average of its components for an alignment reference. GROUP2C is a group made up of four channels, and table 82 shows the offsets in time and voltage that resulted from the forced alignment. In FIG. 13B table 83 indicates that a group called GROUP4B used its component group GROUP2C as the alignment reference. GROUP4B is a group of groups: GROUP2C, GROUP1B and GROUP3B. Table 84 in FIG. 13C is similar, but is for a group that is composed of both other groups and at least one channel. It will be appreciated that once a report is at hand, the information it contains (which will typically be for a large number of channels—many more than we have shown in our example in FIG. 13A-C) can be sorted. That is, a column of interest, say, the VOLTAGE column under OFFSET, could be selected and the order of the channels by rows automatically re-arranged in either ascending or descending order. The ordered list of channels could also then be made available as a menu for other operations.

Finally, note the APPENDIX included in this Specification. It is pseudo/program code that implements various portions of the EDA's internal operations that pertain to forced alignment. Here now is a brief description of that code.

Lines 1 through 8 define constants for the extent of the array of scan points in each eye diagram measurement and the number of channels that are supported. Alternatively, these could be variables adjusted through user control.

Lines 9 through 19 define an enumeration of the types of alignment supported. The enumeration can be extended as additional types are defined. Each alignment type corresponds to a different method of finding the alignment reference position in the eye diagram for a channel. The types given here support the automatic, "forced" alignment techniques. Manual alignment could be represented by the addition of ALIGNED_MANUAL to the enumeration.

Lines 20 through 42 define data structures useful for describing eye measurements. These may be extended for some applications. For example, the EyeData structure may contain fields to hold the time the measurement was taken, the type of clocking in use, and, in the case of a composite eye diagram, the channel(s) which contributed data to the composite. These are omitted here as extraneous to the purpose at hand, namely how to align eye diagrams.

Lines 43 through 49 define a data structure to describe a list of channels in a group. This structure could be extended to include a list of groups within the group as well, but this complexity was omitted from the example for clarity.

Line 51 is a simple declaration of the array of eye diagram measurement results obtained through code not shown here. In a robust system this might be a tree of allocated AlignedEyeData structures, reflecting the organization of groups and group members. Other approaches are also possible. The array form was chosen for clarity in the example.

Lines 54 through 59 represent a code stub. The actual algorithm for finding the reference position within an eye diagram, based on the AlignmentType requested, would replace line 57. This may involve using the histogram techniques illustrated in FIGS. 10 and 11, a "center of gravity" centroid technique, or some other method. These methods are outside the scope of this disclosure. The point is that the function FindReferencePosition applies some algorithm and returns the reference position as a Coord data structure.

Lines 61 through 114 are the main function, DoAlignment. The function receives three parameters, channelsInGroup, alignType, and refChannel. ChannelsInGroup identifies the set of channels that should be mutually aligned. AlignType gives the type of alignment. If the reference position of a channel was already obtained using a different alignment type, it will be realigned using the given type. Ref Channel identifies the channel that is to serve as the reference for computing the offsets of all the other channels. A negative value indicates that the average of the reference positions found for all the channels should serve as the reference.

DoAlignment is composed of three main portions. The first portion, lines 65 through 77, checks each of the channels of interest for an alignment of the desired type and calls FindReferencePosition if the position needs to be found. The result of this section is that all channels of interest have a valid reference position.

The second portion of DoAlignment, lines 78 through 102, finds the reference position to be used for calculating offsets. If refChannel is negative, the average of the reference points is found and stored in the refPoint variable. Otherwise, the reference position for the given refChannel is stored in refPoint for use in calculating offsets. The result of this section is that refPoint has the position reference for calculating the offset for each channel of interest.

The final portion, lines 103 through 113, calculates the offset for each channel, relative to refPoint, and saves the result in that channel's m_alignmentOffset member.

The result of all three sections of DoAlignment is that the reference position and position offsets for each channel of interest have been found. The next step is to display the results.

Lines 115 through 137 define the function GetHitRatioAtPoint which looks up the percentage of hits at a requested measurement point, point, by applying the alignment offset to the requested point, then scaling the resulting position to give row and column indices to obtain the data from the array of measured hits and clock counts. Checking for out of bounds requests has been omitted for clarity.

APPENDIX

```
1   // Number of voltage rows measured
2   const int NUM_ROWS = 100;
3   // Number of time columns measured
4   const int NUM_COLS = 200;
5   // Number of points measured in scan
6   const int NUM_POINTS = NUM_ROWS * NUM_COLS;
7   // Number of channels supported
```

APPENDIX-continued

```
8    const int NUM_CHANNELS = 100;
9    // Types of alignment
10   typedef enum
11   {
12     ALIGNED_NONE,
13     ALIGNED_TRANSITION_VOLTS,
14     ALIGNED_TRANSITION_TIME,
15     ALIGNED_TRANSITION_TIME_VOLTS,
16     ALIGNED_EYE_CENTER_VOLTS,
17     ALIGNED_EYE_CENTER_TIME,
18     ALIGNED_EYE_CENTER_TIME_VOLTS
19   } AlignmentType;
20   // (T, V) coordinate pair
21   typedef struct
22   {
23     double t;
24     double v;
25   } Coord;
26   // Data for a component eye diagram measurement
27   typedef struct
28   {
29     Coord m_origin; // (T, V) at row=0, col=0
30     Coord m_scale; // (Tscale, Vscale) delta between rows and
31   //columns
32     int m_counts[NUM_ROWS][NUM_COLS];
       // 0 if not measured
33     int m_hits [NUM_ROWS][NUM_COLS];
34   } EyeData;
35   // Aligned component eye diagram measurement
36   typedef struct
37   {
38     AlignmentType m_alignmentType;
39     Coord m_alignmentPoint;
40     Coord m_alignmentOffset;
41     EyeData m_data;
42   } AlignedEyeData;
43   // List of channels in a group
44   typedef struct
45   {
46     int m_nMembers; // number of members in group
47     int m_members[NUM_CHANNELS];
       // 0. . .m_nMembers-1: member
48   //channel number
49   } Group;
50   // Eye measurements for all the channels
51   AlignedEyeData data[NUM_CHANNELS];
     // data for each channel
52   // Function to find reference position on one channel (stubbed
53   // out)
54   Coord FindReferencePosition(EyeData data, AlignmentType
55   alignType)
56   {
57     Coord refPoint = < Find the point in data using alignType>
58     return refPoint;
59   }
60   // Function to perform and save alignment
61   void DoAlignment(Group channelsInGroup,
     AlignmentType alignType,
62   int refChannel)
63   {
64     int i;
65     // ---------------------------------------
66     // Find the alignment point in each channel
67     // ---------------------------------------
68     for (i = 0; i < channelsInGroup.m_nMembers; ++i)
69     {
70       int channel = channelsInGroup.m_members[i];
71       if (data[channel].m_alignmentType != alignType)
72       {
73         data[channel].m_alignmentType = alignType;
74         data[channel].m_alignmentPoint =
75         FindReferencePosition(data[channel].m_data, alignType);
76       }
77     }
78     // ---------------------------------------
79     // Get the reference point to align all the channels to
80     // ---------------------------------------
81     Coord refPoint;
82     if (refChannel >= 0)
83     {
84       // Use that particular channel's alignment point as the
85     // reference
86       refPoint = data[refChannel].m_alignmentPoint;
87     }
88     else // use the average of all channels in the group
89     {
90       Coord sum;
91       sum.t = 0;
92       sum.v = 0;
93       for (i = 0; i < channelsInGroup.m_nMembers; ++i)
94       {
95         int channel = channelsInGroup.m_members[i];
96         sum.t += data[channel].m_alignmentPoint.t;
97         sum.v += data[channel].m_alignmentPoint.v;
98       }
99       // Divide by the number of members in the group
100      refPoint.t = sum.t / channelsInGroup.m_nMembers;
101      refPoint.v = sum.v / channelsInGroup.m_nMembers;
102    }
103    // ---------------------------------------
104    // Find and save the offset for each channel in the group
105    // ---------------------------------------
106    for (i = 0; i < channelsInGroup.m_nMembers; ++i)
107    {
108      int ch = channelsInGroup.m_members[i];
109      data[ch].m_alignmentOffset.t =
         data[ch].m_alignmentPoint.t -
110    refPoint.t;
111      data[ch].m_alignmentOffset.v =
         data[ch].m_alignmentPoint.v -
112    refPoint.v;
113    }
114  }
115  // Function to get data at a point in an aligned eye diagram
116  //measurement
117  // Requestor provides point in "aligned" coordinates
118  double GetHitRatioAtPoint(AlignedEyeData data, Coord point)
119  {
120    // Apply the offset
121    double originalT = point.t - data.m_alignmentOffset.t;
122    double originalV = point.v - data.m_alignmentOffset.v;
123    // Make request relative to the origin of the data
124    double deltaT = originalT - data.m_data.m_origin.t;
125    double deltaV = originalV - data.m_data.m_origin.v;
126    // Scale request to the resolution of the data
127    double col = deltaT / data.m_data.m_scale.t;
128    double row = deltaV / data.m_data.m_scale.v;
129    int counts = data.m_data.m_counts[(int) row][(int) col];
130    // Return 0 if not measured
131    if (counts == 0)
132    {
133      return 0;
134    }
135    int hits = data.m_data.m_hits[(int) row][(int) col];
136    return (double) hits / (double) counts;
137  }
```

I claim:

1. A method of measuring a degree of dissimilarity between component eye diagrams in a collection thereof, the method comprising the steps of:
   (a) selecting a reference feature on each component eye diagram in the collection;
   (b) forming a composite eye diagram from the component eye diagrams in the collection, the reference feature of each component eye diagram in the collection being in forced alignment within the composite eye diagram; and
   (c) maintaining a data structure describing offsets needed to align the reference features of the component eye diagrams in the collection and that form the composite eye diagram.

2. A method as in claim 1 wherein at least one of the eye diagrams in the collection is itself a former composite eye diagram that has subsequently been construed as an individual component eye diagram.

3. A method as in claim 1 further comprising the step of generating from the data structure a report of offset data used to force the alignment of step (b).

4. A method as in claim 1 wherein the reference feature for a component eye diagram in the collection is a manually selected location of at least one of time and voltage.

5. A method as in claim 1 wherein the reference feature for a component eye diagram in the collection is an automatically selected transition point.

6. A method as in claim 1 wherein the reference feature for a component eye diagram in the collection is an automatically selected point within the eye opening.

7. A method as in claim 1 wherein the reference feature of a selected component eye diagram in the collection is taken as an alignment reference to which all other component eye diagrams in the collection are force aligned during step (b).

8. A method as in claim 7 wherein in response to clicking on a selected displayed icon the selected component eye diagram is automatically chosen to be the next one in a sequence of component eye diagrams listed in a menu thereof.

9. A method as in claim 1 wherein an arithmetic combination in at least one of time and voltage of all the reference features for component eye diagrams in the collection is taken an alignment reference to which all eye diagrams in the collection are force aligned during step (b).

* * * * *